(12) United States Patent
Shim et al.

(10) Patent No.: US 10,401,974 B2
(45) Date of Patent: Sep. 3, 2019

(54) HIGHLY SENSITIVE PRESSURE SENSOR AND INPUT DEVICE USING THE SAME

(71) Applicant: Industry-Academic Cooperation Foundation, Yonsei University, Seoul (KR)

(72) Inventors: Woo Young Shim, Seoul (KR); Tae Yoon Lee, Seoul (KR); Kil Soo Lee, Seoul (KR); Jae Hong Lee, Suncheon-si (KR); Dae Eun Kim, Seoul (KR)

(73) Assignee: Industry-Academic Cooperation Foundation, Yonsei University, Seoul (KR)

( * ) Notice: Subject to any disclaimer, the term of this patent is extended or adjusted under 35 U.S.C. 154(b) by 155 days.

(21) Appl. No.: 15/266,175

(22) Filed: Sep. 15, 2016

(65) Prior Publication Data

US 2017/0083107 A1 Mar. 23, 2017

(30) Foreign Application Priority Data

Sep. 18, 2015 (KR) ........................ 10-2015-0132469
Dec. 15, 2015 (KR) ........................ 10-2015-0179011
Aug. 23, 2016 (KR) ........................ 10-2016-0106845

(51) Int. Cl.
| | | |
|---|---|---|
| *G06F 3/02* | (2006.01) | |
| *G09G 5/00* | (2006.01) | |
| *G06F 3/023* | (2006.01) | |
| *G06F 3/041* | (2006.01) | |
| *G06F 3/044* | (2006.01) | |
| *G01L 1/14* | (2006.01) | |
| *G06F 3/047* | (2006.01) | |

(Continued)

(52) U.S. Cl.
CPC .............. *G06F 3/023* (2013.01); *G01L 1/146* (2013.01); *G06F 3/0202* (2013.01); *G06F 3/03547* (2013.01); *G06F 3/044* (2013.01); *G06F 3/047* (2013.01); *G06F 3/0414* (2013.01); *G06F 3/04883* (2013.01); *H03K 17/9622* (2013.01)

(58) Field of Classification Search
CPC ....... G01L 1/146; G06F 3/0202; G06F 3/023; G06F 3/0414; G06F 3/044
See application file for complete search history.

(56) References Cited

U.S. PATENT DOCUMENTS

| 2014/0139436 A1* | 5/2014 | Ramstein ............ H01L 41/0986 345/168 |
|---|---|---|
| 2014/0150572 A1* | 6/2014 | Lim ........................ G01L 1/142 73/862.626 |

FOREIGN PATENT DOCUMENTS

| KR | 1020100131349 | 12/2010 |
|---|---|---|
| KR | 1020140047923 | 4/2014 |

OTHER PUBLICATIONS

Slezak, "Pencil sketches turn paper into a sensor," *New Scientist*, 2015. Retrieved from https://www.newscientist.com/article/dn27189-pencil-sketche s-turn-paper-into-a-sensor/ Nov. 29, 2016.

* cited by examiner

*Primary Examiner* — Insa Sadio
(74) *Attorney, Agent, or Firm* — Norton Rose Fulbright US LLP

(57) ABSTRACT

Provided is a highly sensitive pressure sensor that includes a lower substrate on which a first electrode having surface roughness is formed; an upper substrate on which a second electrode having surface roughness is formed; and a dielec- (Continued)

tric material stacked between the lower substrate and the upper substrate to be disposed between the first electrode and the second electrode.

19 Claims, 18 Drawing Sheets

(51) Int. Cl.
*H03K 17/96* (2006.01)
*G06F 3/0488* (2013.01)
*G06F 3/0354* (2013.01)

FIG. 4
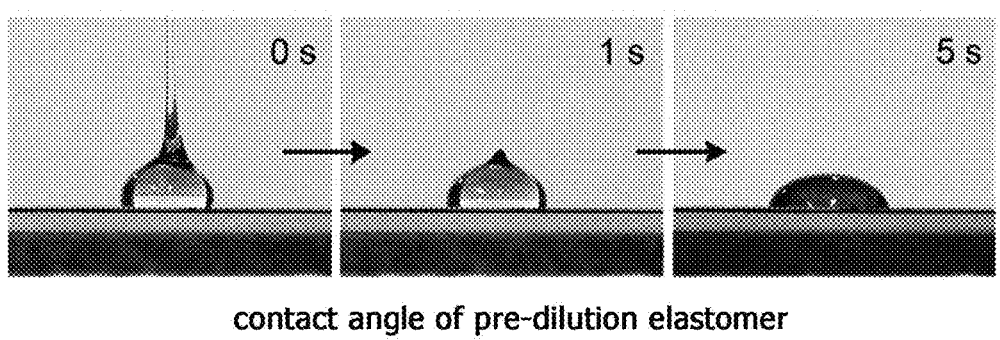
contact angle of pre-dilution elastomer
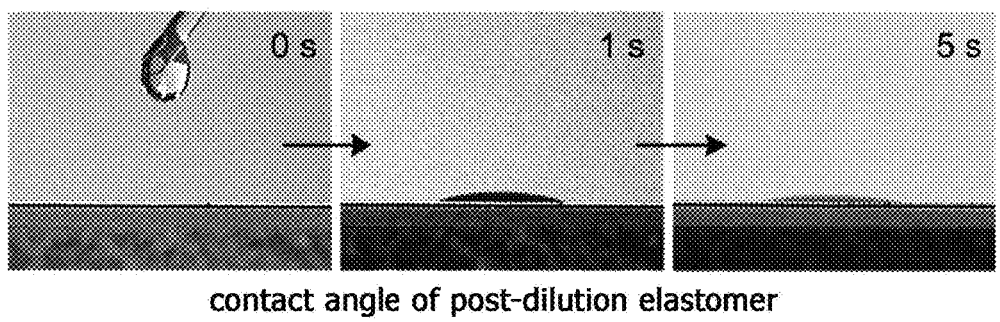
contact angle of post-dilution elastomer

FIG. 5A

| liquid | substrate | angle | |
|---|---|---|---|
| water | wafer | 40.9° | |
| | ITO slide | 85.8° | |
| | graphite substate | 70(±5)° | |

| liquid | substrate | angle | |
|---|---|---|---|
| diluted elastomer | wafer | 4.08° | |
| | ITO slide | 2.88° | |
| | graphite substate | 3.12° | |

GRAPHITE ELECTRODE    DILUTED ELASTOMER ON GRAPHITE ELECTRODE

GRAPHITE ELECTRODE    DILUTED ELASTOMER ON GRAPHITE ELECTRODE

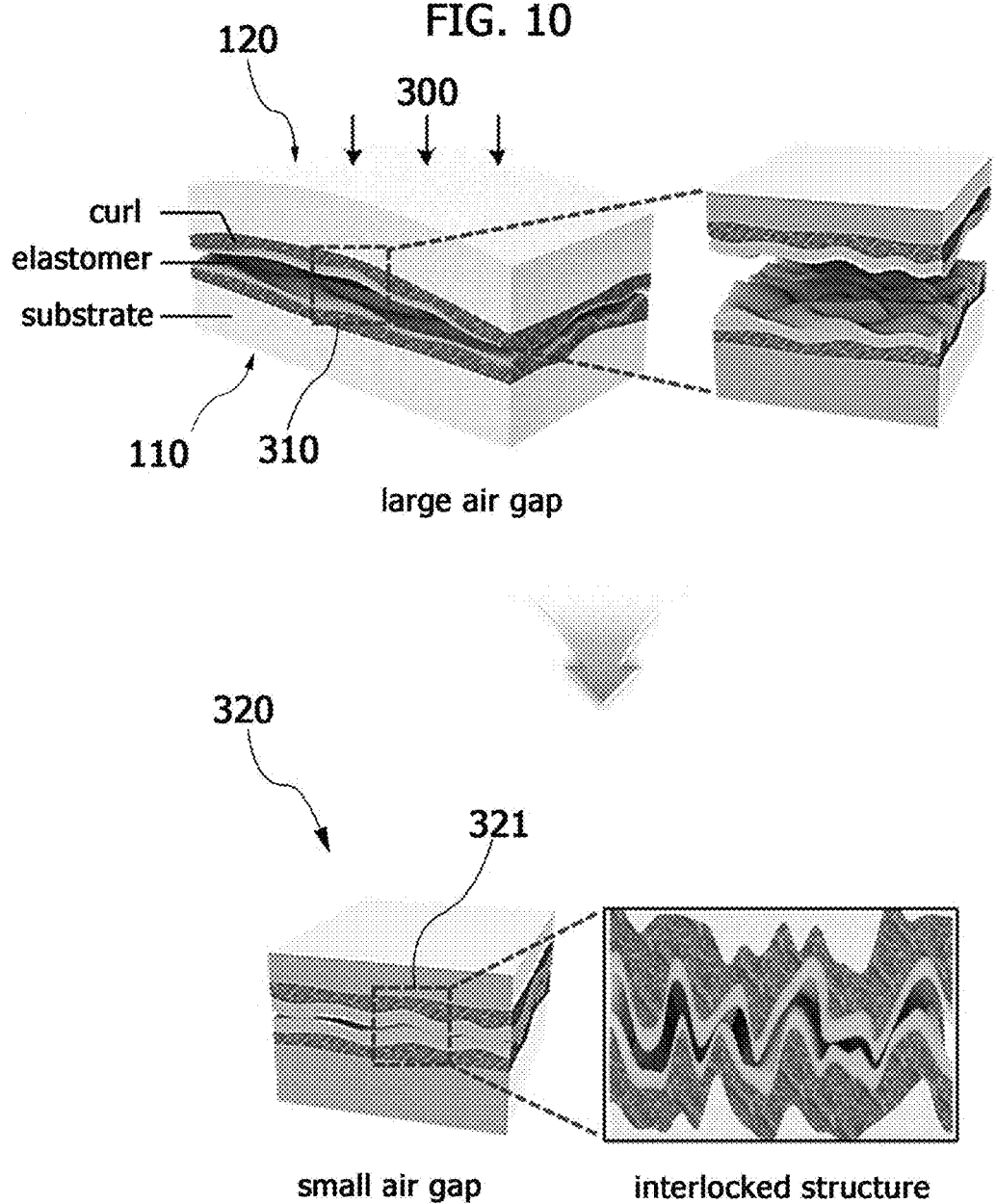

FIG. 11A
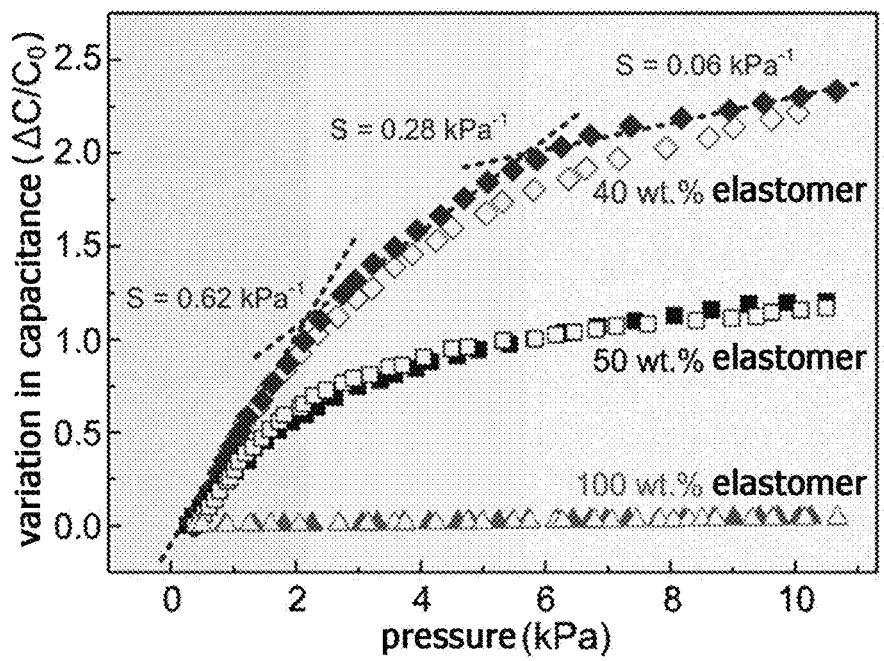
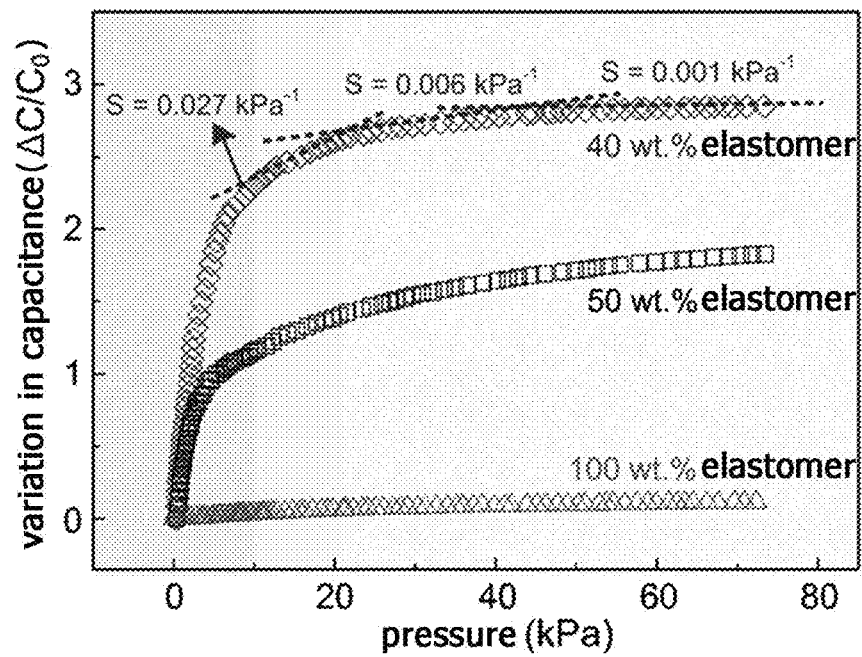

FIG. 12B
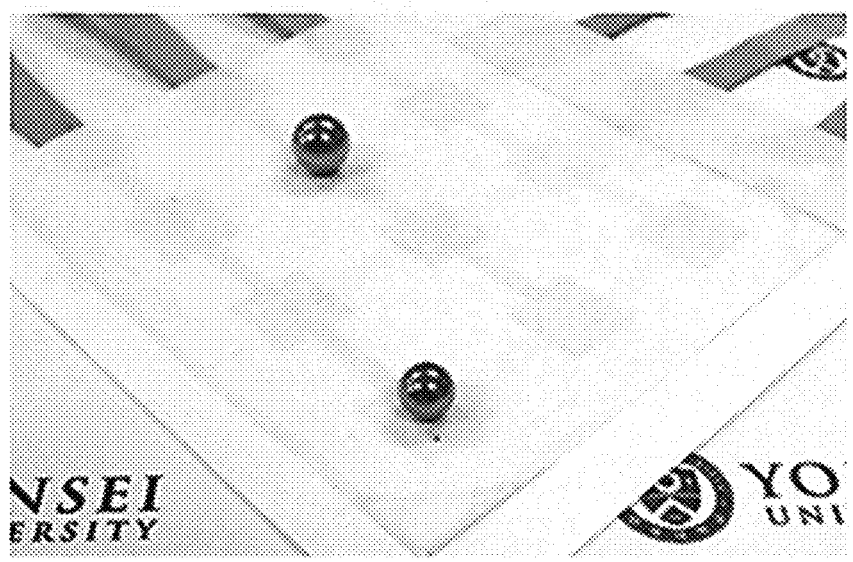
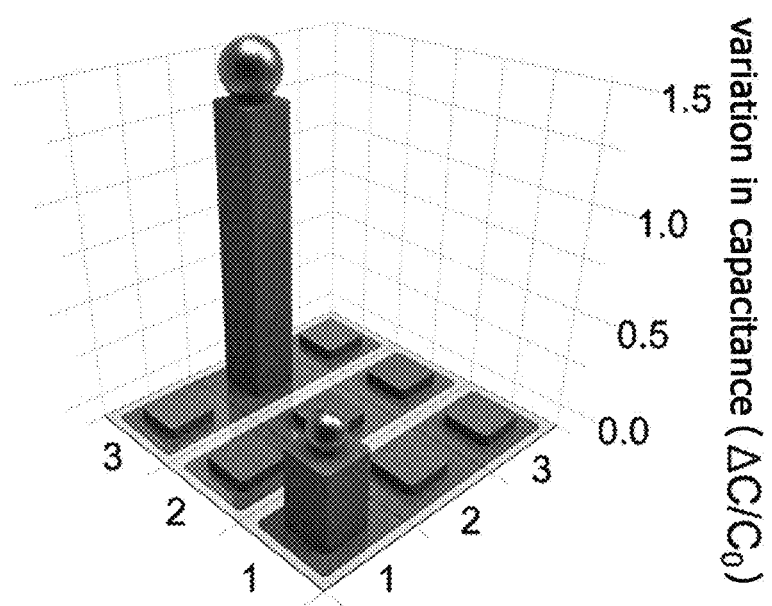

HIGHLY SENSITIVE PRESSURE SENSOR AND INPUT DEVICE USING THE SAME

CROSS-REFERENCE TO RELATED APPLICATIONS

This U.S. non-provisional patent application claims priority under 35 U.S.C. § 119 to Korean Patent Application No. 10-2015-0132469 filed on Sep. 18, 2015, 10-2015-0179011 filed on Dec. 15, 2015, and 10-2016-0106845 filed on Aug. 23, 2016, the entire contents of which are hereby incorporated by reference.

BACKGROUND OF THE INVENTION

The present invention disclosed herein relates to a pressure sensor and input device, and more particularly, to a highly sensitive pressure sensor that may implement highly sensitive sensing with a simple configuration, and an input device using the same.

Demand for the development of various sensor technologies continues to increase due to the advent of the internet of things (IoT) era that connects things by using a digital technology. In particular, a touch/pressure sensor is a sensor that is widely used for most of daily things, such as flexible/wearable devices, robots, and health care as well as spaces closely connected with life, such as homes, factories, offices, and cars, but it has a limitation in that the costs of material and process are significantly high. The reason is that materials mostly used as electrodes so far, for example the prices of gold, silver, metal based nano wire, indium tin oxide (ITO), and carbon nano tube (CNT) are relatively high. Also, a study to form a micro-structure through the remodeling of the structure of a dielectric layer in order to increase the sensitivity of a pressure sensor in an existing parallel-plate capacitor structure is being actively conducted, but it is true that the cost of a process is significantly high because complicated processes, such as photo-lithography and etching are needed.

For this reason, most highly sensitive pressure sensors are staying in a study stage and fail to lead to commercialization. Thus, there is a need for the development of a new-concept high-performance pressure sensor that may overcome the limitation of an existing pressure sensor using a high-priced material and manufactured through a silicon process to minimize material and process costs.

PATENT LITERATURE (Patent Literature 1) Korean Patent Publication No. 10-2012-0098749

SUMMARY OF THE INVENTION

According to various embodiments of the present invention, it is possible to provide an input device that uses a highly sensitive pressure sensor configured to be capable of being easily manufactured based on low-priced materials commonly used.

According to various embodiments of the present invention, it is possible to provide an input device that uses a highly sensitive pressure sensor for inputting various keys based on pressure by using the highly sensitive pressure sensor.

According to an embodiment of the present invention, there is provided a highly sensitive pressure sensor including a lower substrate on which a first electrode having surface roughness is formed; an upper substrate on which a second electrode having surface roughness is formed; and a dielectric material stacked between the lower substrate and the upper substrate to be disposed between the first electrode and the second electrode.

The dielectric material may cover an uneven surface of the first electrode or the second electrode by the surface roughness of the first electrode or the second electrode.

The dielectric material may include elastomer, wherein weight percentage in the dielectric material of the elastomer may be determined according to the surface roughness and a thickness of the formed dielectric material.

The lower substrate or the upper substrate may be a flexible or stretchable material.

The surface roughness of the first electrode or the second electrode may be represented by surface roughness of the lower substrate or the upper substrate.

The surface roughness of the first electrode or the second electrode may be generated when an electrode is formed or generated by processing after the electrode is formed.

The dielectric material may include a lower dielectric layer that the first electrode has; and an upper dielectric layer that the second electrode has.

The lower dielectric layer may be in close contact with the first electrode to allow the surface roughness of the first electrode to be represented on the lower dielectric layer, and the upper dielectric layer may be in close contact with the second electrode to allow the surface roughness of the second electrode to be represented on the upper dielectric layer.

An air layer may be formed in a portion of a region between the lower dielectric layer and the upper dielectric layer.

An interlocked structure may be formed by engaging of at least a portion of surfaces of the lower dielectric layer and the upper dielectric layer, in a case where pressure is applied to at least one of the lower substrate and the upper substrate.

The air layer formed between the lower dielectric layer and the upper dielectric layer may be removed or divided into smaller air layers based on the interlocked structure, in a case where pressure is applied to at least one of the lower substrate and the upper substrate.

According to another embodiment of the present invention, there is provided an input device using a highly sensitive pressure sensor, the input device including at least one highly sensitive pressure sensor of any one of claims 1 to 11; and a control unit that handles a designated key input according to a signal output from the pressure sensor with respect to applied pressure when pressure is applied to the highly sensitive pressure sensor.

The input device may further include a pressure application unit that applies pressure to one or more of the lower substrate or the upper substrate.

The control unit may be configured to: handle as a first signal in a case where the applied pressure is lower than a first reference pressure that is preset, and handle as a second signal in a case where the applied pressure is equal to or higher than the first reference pressure.

The control unit may ignore a corresponding input in a case the applied pressure is lower than a second reference pressure that is preset.

The control unit may perceive as different inputs according to strength, time or frequency of the applied pressure.

The control unit may include a main control unit that outputs an excitation signal input to the pressure sensor and inputs the signal output from the pressure sensor; a de-multiplexer that divides the excitation signal into at least one pressure sensor; and a multiplexer that converts parallel signals output from the at least one pressure sensor into a serial signal.

The control unit may divide the signal received through the main control unit into a plurality of levels having a range with respect to the at least one highly sensitive pressure sensor, and different keys may be designated for the plurality of levels, respectively.

The control unit may determine a designated key for a level of the signal based on the signal received through the main control unit and the highly sensitive pressure sensor outputting the signal, and transmit to the multiplexer to input the determined key.

The signal may be a capacitance value corresponding to applied pressure with respect to the at least one highly sensitive pressure sensor.

BRIEF DESCRIPTION OF THE DRAWINGS

The accompanying drawings are included to provide a further understanding of the present invention, and are incorporated in and constitute a part of this specification. The drawings illustrate exemplary embodiments of the present invention and, together with the description, serve to explain principles of the present invention. In the drawings:

FIG. 4 is a diagram showing the contact angles of pre-dilution elastomer and post-dilution elastomer;

FIG. 5A is a diagram showing the contact angles of the water dropped to various substrates and diluted elastomer.

FIG. 10 is a diagram showing a variation in dielectric surface before and after pressure is applied, in an input device using a highly sensitive pressure sensor according to an embodiment of the present invention;

FIG. 11A and FIG. 11B are a diagram showing a graph of variation in capacitance according to applied pressure and an input device using a highly sensitive pressure sensor according to an embodiment of the present invention;

FIG. 12B is a diagram showing sensitivity in the case where balance weights having different weights are put on two points of the 3×3 pressure sensor array;

DETAILED DESCRIPTION OF PREFERRED EMBODIMENTS

Figure 1:
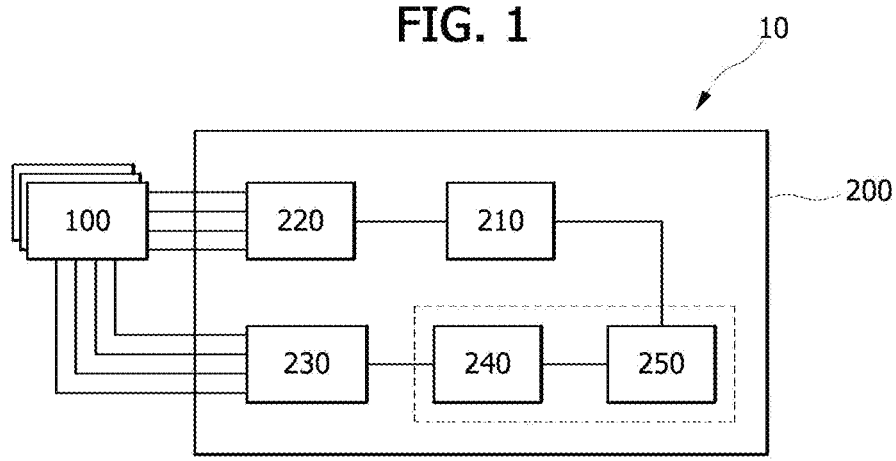
FIG. 1 is a block diagram of an input device using a highly sensitive pressure sensor according to an embodiment of the present invention.

In the following, embodiments of the present invention are described with reference to the accompanying drawings.

Since embodiments of the present invention may make various changes and have many embodiments, particular embodiments will be illustrated in the drawings and described in detail in the detailed description. However, inventors do not intend to limit the present invention to particular embodiments and it should be understood that the present invention covers all changes, equivalents, and/or replacements that fall within the spirit and technical scope of the present invention. In describing the drawings, similar components may be denoted through the use of similar reference numerals.

The expression "include" or "may include" that may be used in various embodiments of the present invention indicates the presence of a disclosed corresponding function, operation or component but does not exclude one or more functions, operations or components in addition.

In various embodiments of the present invention, it should also be understood that the terms "includes" and "has" indicate the presence of characteristics, numbers, steps, operations, components, parts or combinations thereof represented in the present disclosure and do not exclude the presence or addition of one or more other characteristics, numbers, steps, operations, components, parts or combinations thereof.

The expression "or" in the various embodiments of the present invention includes any and all combinations of enumerated words. For example, the expression "A or B" may include A, B, or both A and B.

The expression "first", "second", "firstly", or "secondly" in the various embodiments of the present invention may modify various components of the present invention but does not limit the order and/or importance of corresponding components. Also, the expressions above may be used to distinguish one element from another.

When in the various embodiments of the present invention, any component is referred to as being "connected" or "accessed" to another component, it should be understood that the former can be directly connected or accessed to the latter, or that there may be another component in between. On the contrary, when any component is referred to as being "directly connected" or "directly accessed" to another component, it should be understood that there may be no other component in between.

In the various embodiments of the present invention, descriptions according to expressions, such as 'substantially' or 'for example' may indicate that presented information, such as a cited property, variable or value may not accurately match. However, such a mismatch should not limit an embodiment of the present invention according to the various embodiments of the present invention to an effect, such as a variation including a tolerance, error of measurement, the limit of measurement accuracy, and a typically known other factor.

The terms used in the various embodiments of the present invention are used to describe specific embodiments and are not intended to limit the present invention. The terms in singular form may include the plural form unless otherwise specified.

Also, it should be construed that all terms used herein including technical or scientific terms have the same meanings as those generally understood by a person skilled in the art, and should not be construed as having an ideal or excessively formal meaning unless or not be narrowly construed otherwise defined in the various embodiments of the present invention.

In the following, various embodiments according to the present invention are described in detail with reference to the accompanying drawings, the same or similar components have the same reference numerals irrespective of the drawings and related redundant descriptions may be omitted.

An input device using a highly sensitive pressure sensor according to an embodiment of the present invention includes a plurality of pressure sensors 100 and a control unit 200 that applies excitation signals to the pressure sensors and controls the outputs of the pressure sensors.

In the following, the highly sensitive pressure sensor 100 according to various embodiments of the present invention and an input device 10 using the highly sensitive pressure sensor 100 are described with reference to FIGS. 1 to 19.

Referring to FIG. 1, the input device using the highly sensitive pressure sensor according to an embodiment of the present invention (hereinafter, referred to as the input device 10) includes a plurality of highly sensitive pressure sensors 100 (hereinafter, referred to as pressure sensors 100) and the control unit 200 that applies excitation signals to the highly sensitive pressure sensors 100 and controls the outputs of the pressure sensors.

The highly sensitive pressure sensor 100 according to an embodiment of the present invention partly employs the structure of a parallel-plate capacitor, and fundamentally detects pressure applied to the highly sensitive pressure sensor 100 outside based on a variation in the capacitance of the parallel-plate capacitor.

Figure 2:
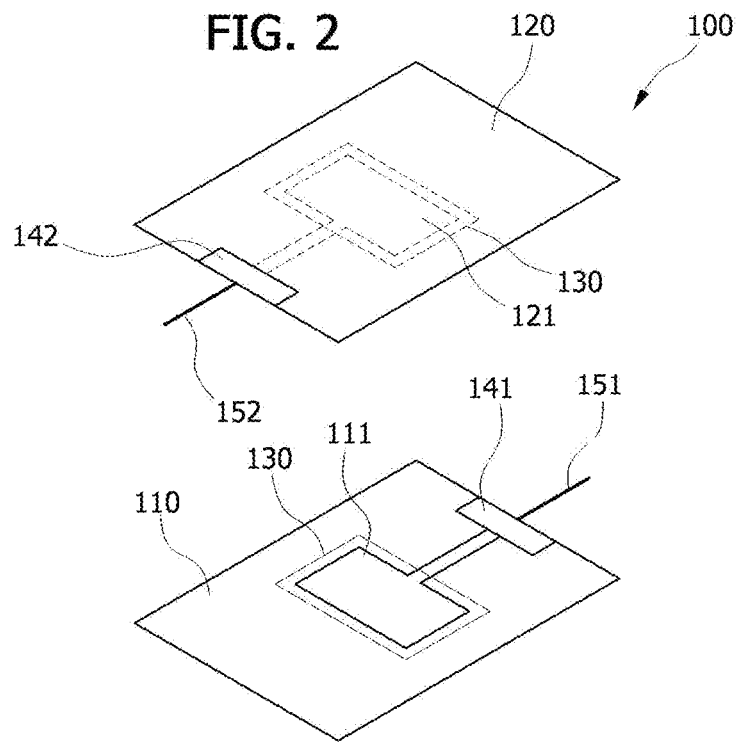
FIG. 2 is a perspective view of a pressure sensor in an input device using a highly sensitive pressure sensor according to an embodiment of the present invention.

The structure of the pressure sensor 100 includes two substrates, e.g., a lower substrate 110 and an upper substrate 120, as shown in FIG. 2, and electrodes 111 and 121 and dielectrics (or dielectric layers 130) are respectively formed on one surface of the lower substrate 110 and the upper substrate 120. At this point, it is possible to express the dielectric on the lower substrate 110 as a lower dielectric (or lower dielectric layer) and the dielectric on the upper substrate 120 as an upper dielectric (or upper dielectric layer).

Figure 3:
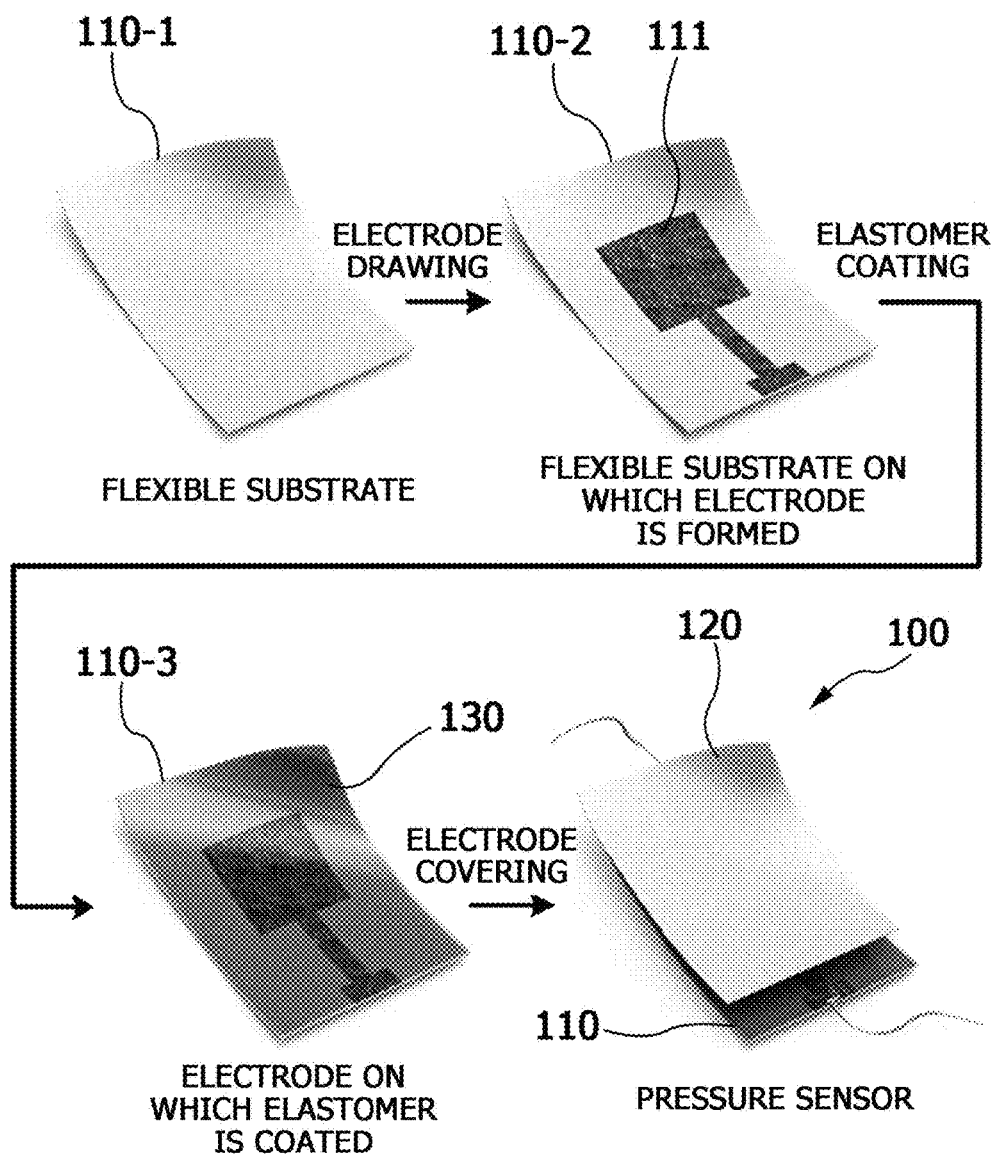
FIG. 3 is a diagram showing the process of manufacturing a pressure sensor which is applied to an input device using a highly sensitive pressure sensor according to an embodiment of the present invention.

According to an embodiment, referring to FIG. 3 in order to describe the manufacturing method of the pressure sensor 100, the lower substrate 100 forms a first electrode 111 on a flexible substrate 110-1 and forms the dielectric 130 on a flexible substrate 110-2 on which the first electrode 111 is formed, so it is possible to provide a lower substrate 110-3 having roughness expressed on the dielectric.

Here, the flexible substrate may be formed as a substrate that has a flexible and/or stretchable property bent based on force applied from the outside of the substrate, force generated from the inside of the substrate, and/or force generated from the surface of the substrate.

Likewise, the upper substrate 120 is also generated in the same or similar method as the manufacturing method of the lower substrate 110-3, and the lower substrate 110 and the upper substrate 120 may form the dielectrics on respective substrates to allow the dielectrics to face each other to make up the pressure sensor 100. In the following, in the case where the lower substrate 110 and the upper substrate 120 are referred to, they may represent substrates on which the electrodes 111 and 121 and the dielectrics 130 are formed, unless especially otherwise described.

Turning back to FIG. 2, the first electrode 111 and the second electrode 121 formed on the lower substrate 110 and the upper substrate 120, respectively may be externally connected to the outside of the substrates 110 and 120 through connection wires 151 and 152. Also, the electrodes 111 and 121 may be connected to the connection wires 151 and 152, respectively by using connection ends 141 and 142. Here, the connection ends 141 and 142 may be formed by including silver paste.

As described above, the highly sensitive pressure sensor according to an embodiment of the present invention may perform the role of a parallel-plate capacitor that includes the first electrode 111, the second electrode 121, and the dielectric formed between the first electrode 111 and the second electrode 121. Also, pressure applied from the outside is detected based on a variation in the capacitance of such a parallel-plate capacitor. Here, the applied pressure may also be expressed as force and/or weight.

The capacitance of such a capacitor is defined by Equation 1 below:

$$C = \varepsilon_0 \varepsilon_r A/d \quad (1)$$

(where C denotes capacitance, $\varepsilon_0$ denotes the dielectric constant (or permittivity) of vacuum, $\varepsilon_r$ denotes effective dielectric constant, A denotes the area between electrodes, and d denotes the distance between electrodes).

Referring to Equation 1 above, in the case of the parallel-plate capacitor, when pressure 300 is applied through a pressure application unit as shown in FIG. 10, a variation in capacitance occurs when the material between capacitors or the distance between substrates varies. For example, the parallel-plate capacitor fundamentally increases in capacitance because its thickness thins when pressure is applied through the pressure application unit.

The pressure application unit may mean e.g., at least a part of one surface of the lower substrate 110 on which the electrode 111 is not formed (e.g., the lower surface of the lower substrate 110) or one surface of the upper substrate 120 on which the electrode 121 is not formed (e.g., the lower surface of the upper substrate 120), or may be formed on the at least a part.

However, in the case of a general pressure sensor, a variation in capacitance is not substantially significant because the distance between electrodes is significantly small in comparison to applied pressure due to the high elastic resistance of a dielectric. Thus, it is possible to apply roughness and a curl to the pressure sensor 100 in order to control the effective dielectric constant and/or the area A between electrodes as well as the distance d between electrodes.

At this point, in the case of the roughness, it is possible to use unintended roughness that is formed by rubbing (or drawing) on the substrates 110 and 120. Here, the roughness is to represent the roughness (Rc, mean height of the profile elements) of the surfaces of the electrodes 111 and 121 formed on the substrates 110 and 120, but the embodiment is not limited thereto and may represent the roughness of the surfaces of the dielectrics 130 formed on substrates (e.g., the lower substrate 110 and the upper substrate 120) and/or the electrodes 111 and 121.

The surfaces of the electrodes 111 and 121 formed on the substrates 110 and 120 may be formed to have roughness of a designated size or larger, e.g., roughness of 6 μm or larger, desirably roughness of 7 μm or larger.

The electrodes 111 and 121 on the substrates 110 and 120 may be formed of a material having conductivity, such as graphite and may be formed on the substrates 110 and 120 by drawing or writing.

For example, it is possible to form a material (e.g., graphite) for forming the electrode in a bar shape (e.g., a pencil or charcoal) and rub the substrates 110 and 120 with the material to form the electrodes 111 and 121. At this point, by adjusting strength rubbing the substrates 110 and 120 with the bar for forming the electrode, it is possible to determine the roughness and/or thickness of the electrodes 111 and 121 on the substrates 110 and 120.

Also, although the drawing or writing method is described as a method of forming the electrodes on the substrates 110 and 120, the embodiment is not limited thereto and the electrodes may be formed by various methods, such as printing, spin coating or spraying (or applying).

Although according to the descriptions above, it is described that the electrodes 111 and 121 are formed of graphite, the embodiment is not limited thereto and various materials having conductivity, including metal, such as silver nanoparticle, carbon black, carbon allotrope, such as carbon nano tube (CNT), and organic materials, such as PEDOT-PSS may also be used.

In order to form the electrodes 111 and 121, a material having roughness, e.g., paper or plastic may also be used as the substrates 110 and 120. In the case where the paper is used as the substrate, paper having a coated surface may be used not to be wet in a dielectric spraying process. In addition, it is also possible to process a substrate surface to artificially form roughness.

The dielectrics 130 are formed on the substrates 110 and 120 and on the electrodes 111 and 121 on the substrates 110 and 120. At this point, the formed dielectric 130 reflects the surface roughness of the electrodes 111 and 121 based on thickness, so a micro-structure (or uneven structure) by the surface roughness of the electrodes 111 and 121 is formed on a dielectric 130 surface.

At this point, the dielectrics formed on the electrodes 111 and 121 are elastomer and general elastomer may be formed to be about several micrometers in thickness due to high viscosity even when spin coating RPM increases. Also, since the elastomer formed on the electrodes 111 and 121 has a characteristic that it becomes flat because self-leveling occurs upon curing, the elastomer has a limitation in utilizing the roughness of the electrode formed on the flexible substrate.

Thus, there is a need to provide a method for forming dielectrics having a designated thickness or smaller on the electrodes 110 and 120 by using the elastomer and implementing the roughness of the electrodes 111 and 121 on a dielectric surface.

According to an embodiment, the dielectrics 130 formed on the electrodes 111 and 121 may be formed by the mixing of one or more of dielectric materials. For example, the dielectric 130 according to an embodiment of the present invention may be used by the mixing of the elastomer with various solvents and needs to use the viscoelastic property of diluted elastomer to optimize a thickness.

For example, it is possible to use, as the material of the dielectric 130, a solvent that is formed by using the thermodynamic simultaneous mixing of the elastomer and hydrocarbon and has significantly low viscosity.

At this point, the thermodynamic simultaneous mixing depends on the solubility parameter between materials and it is possible to use Equation 2 below for Gibbs free energy upon mixing and Equation 3 for the relation between a variation in enthalpy and the solubility parameter:

$$\Delta G_m = \Delta H_m - T\Delta S_m \quad (2)$$

(where $\Delta G_m$ denotes Gibbs free energy, $\Delta H_m$ denotes a variation in enthalpy upon mixing, T denotes absolute temperature, and $\Delta S_m$ denotes a variation in entropy upon mixing), and $$\Delta H_m \propto (\delta_e - \delta_s)^2 \quad (3)$$

(where $\delta_e$ denotes the solubility parameter of the elastomer, and $\delta_s$ denotes the solubility parameter of the hydrocarbon).

Since materials are likely to be easily mixed because the Gibbs free energy $\Delta G_m$ decreases as the solubility parameter value between the materials is similar each other and in general, a thermodynamic simultaneous reaction quickly progresses as the value is smaller than zero.

According to an embodiment of the present invention, polydimethylsiloxane (PDMS), ecoflex, etc. may be used as the elastomer for forming the dielectric, and hexane, heptane, etc. may be used as the hydrocarbon. At this point, the solubility parameters of the elastomer and the hydrocarbon are 7.4 and 7.3 cal1/2 cm-3⁄2, respectively and because they make the Gibbs free energy a value smaller than zero, simultaneous mixing occurs.

As described above, a solvent made through the simultaneous mixing significantly decreases in viscosity and as shown in FIG. 4, it is possible to easily discern the viscosity by the comparing of the contact angles of pre-/post-dilution (mixing) elastomer on the surfaces of the electrodes 111 and 121.

In the case of diluted with the hydrocarbon (post-dilution) elastomer, viscosity significantly decreases in comparison to the pre-dilution elastomer and a contact angle significantly decreases due to the low surface tension of the hydrocarbon itself.

That is, as the weight percentage of the diluted elastomer decreases, a contact angle at a surface according to the weight percentage of the formed dielectric 130 decreases, so as the weight percentage decreases as in an embodiment in the table below, it is possible to form elastomer having a thin thickness:

TABLE 1

Thickness of dielectric layer to be formed according to weight percentage of elastomer

| No. | Weight percentage (wt. %) | Thickness of layer to be formed (μm) |
|---|---|---|
| 1 | 50 | 10.5 |
| 2 | 40 | 6.4 |
| 3 | 30 | 3.3 |
| 4 | 20 | 1.7 |
| 5 | 10 | 0.8 |
| 6 | 5 | 0.3 |

Also, in the case of original general liquid, a contact angle may vary according to the hydrophilic/hydrophobic property of a substrate as in the upper table in FIG. 5A. However, in the case of elastomer diluted with the hydrocarbon, it is possible to see that the contact angle significantly decreases without significantly caring about a type of substrate as in the lower table in FIG. 5A.

Figure 5B:
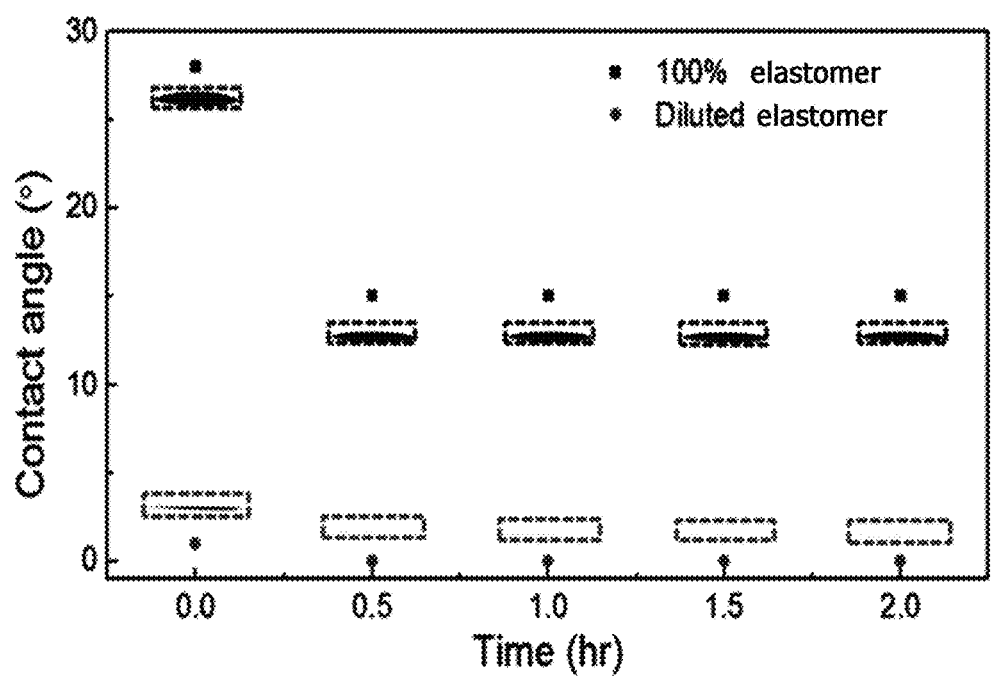
FIG. 5B is a diagram showing contact angles according to the curing time of the elastomer dropped to a graphite electrode.
Figure 6:
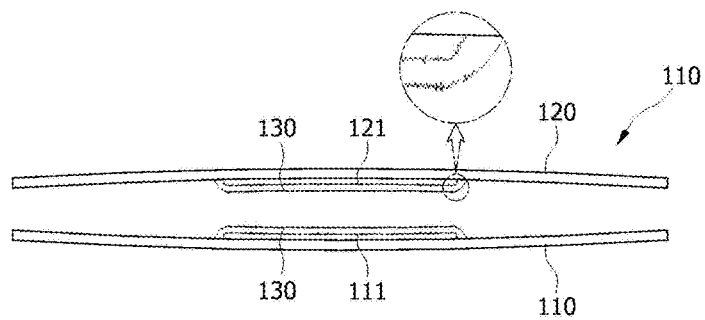
FIG. 6 is a cross-sectional view of a highly sensitive pressure sensor having roughness expressed on the surfaces of an electrode and a dielectric in an input device using a highly sensitive pressure sensor according to an embodiment of the present invention.
Figure 7:
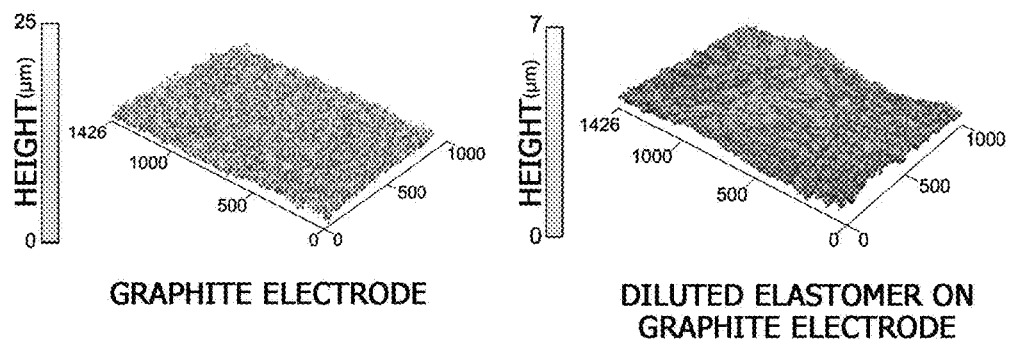
FIGS. 7 and 8 are diagrams that respectively show the confocal microscope image and roughness analysis data of the electrode surface and elastomer-coated surface roughness of a pressure sensor which is applied to an input device using a highly sensitive pressure sensor according to an embodiment of the present invention.
Figure 8:
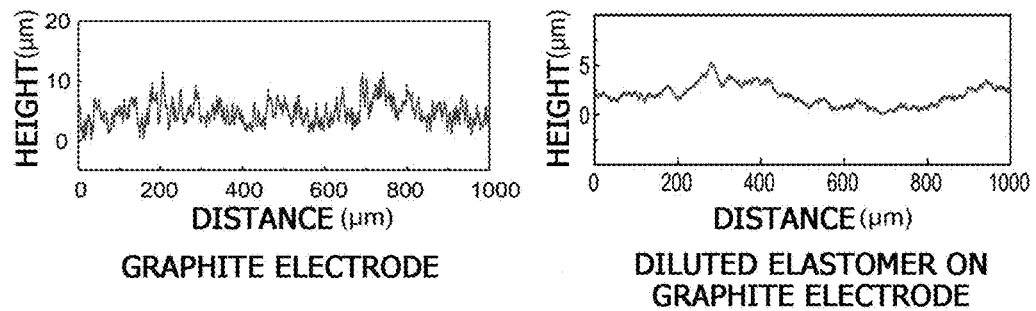

As shown in FIG. 5B, while curing progresses, the contact angle further decreases, which means that it is possible to form the dielectric layer 130 having a significantly thin thickness. In the case of the elastomer diluted with the hydrocarbon, a contact angle at a corresponding substrate significantly is small and as the time goes by, the contact angle ultimately approaches zero (full wetting). Thus, the formed dielectric 130 may effectively implement the surface roughness of the electrodes 111 and 121 as shown in FIGS. 6 and 8.

That is, the surfaces of the dielectrics 130 formed on the lower substrate 110 and the upper substrate 120 may be formed so that the roughness of the surfaces of the electrodes 111 and 121 formed on the substrates 110 and 120, respectively is partly reflected.

For example, the roughness of a dielectric surface may adjust a thickness by the adjusting of the dilution level of the elastomer and a spin coating condition. In this study, when the mass percentage of elastomer on an electrode (e.g., graphite) having roughness of 6 μm or 7 μm or more is 30 wt. % to 50 wt. %, desirably 35 wt. % to 45 wt. %, more desirably 40 wt. %, it is possible to form a micro-structure in which the roughness Rc of a dielectric 130 surface is about 0 μm to about 7 μm, desirably about 0 μm to about 4 μm.

It is possible to determine the weight percentage of the elastomer according to the surface roughness of the electrodes 111 and 121, so the weight percentage of the elastomer may be appropriately selected according to the material of the electrode and it is obvious that this case should also be included in the protective scope of the present invention.

According to the descriptions above, in forming the roughness of the dielectric 130 surface, it is possible to determine mass percentage for the dilution of elastomer and a spin coating condition to form 4 μm to 6 μm microstructures.

According to various embodiments, the thickness of the dielectric layer 130 may be formed to satisfy at least one of conditions, i) elastomer having a thinnest thickness in order to effectively express the roughness of the surfaces of the electrodes 111 and 121, ii) a thickness within a range not exceeding the dielectric strength of elastomer when an applied voltage is considered, and iii) a thickness within a range not forming a defect, such as a pin-hole by the roughness of the surfaces of the electrodes 111 and 121.

According to a desirable embodiment, in order to satisfy the conditions i) and ii), the surface roughness of the formed dielectric 130 may be formed to be the same or thin based on the surface roughness of the substrates 110 and 120 and/or the electrodes 111 and 121 formed on the substrates 110 and 120.

Referring to Table 1 to this end, as the surface roughness of the substrates 110 and 120 and/or the electrodes 111 and 121 formed on the substrates 110 and 120 rises, the weight percentage of diluted elastomer may rise. On the contrary, as the surface roughness of the substrates 110 and 120 and/or the electrodes 111 and 121 formed on the substrates 110 and 120 decreases, the weight percentage of elastomer may decrease.

In the case where pressure 300 is applied to a micro-structure having a rough surface formed on the surfaces of the dielectrics 130 of the lower substrate 110 and the upper substrate 120 as shown in FIG. 10, parts of the surfaces of facing dielectrics 130 come into contact with each other, so the surface of the first electrode 111 of the lower substrate 110 and the surface of the second electrode 121 of the upper substrate 120 may form a sort of interlocked structure 321.

Such an interlocked structure is similar to an inner structure when pressure is applied in order to sense a touch with a human being's finger. For example, the inside of the human being's finger has the interlocked structure of epidermis and dermis. Such an interlocked structure may perform a role in enhancing spatial resolution by the amplifying of the touch signal of a part to which a stimulus is directly applied.

Likewise, the pressure sensor 100 implements a structure in which parts of the surface of the dielectric 130 come into contact with each other and the rough surfaces of the dielectric 130 engage in the case pressure 300 is applied, as described above. That is, since the surfaces of the electrodes 111 and 121 that are the bases of the rough surfaces of the dielectrics 130 also form an interlocked structure, it is possible to increase the area A between electrodes that affects the determination of capacitance.

In addition, in order to effectively generate the difference of capacitance by using the roughness of the surfaces formed on the lower substrate 110 and the upper substrate 120 that make up the pressure sensor 100, there is a need to maintain the distance between electrodes to be a designated distance or longer.

To this end, curls are formed on the lower substrate and the upper substrate and accordingly, it is possible to form an air layer (or air gap) between the facing dielectrics of the lower substrate 110 and the upper substrate 120.

Figure 9:
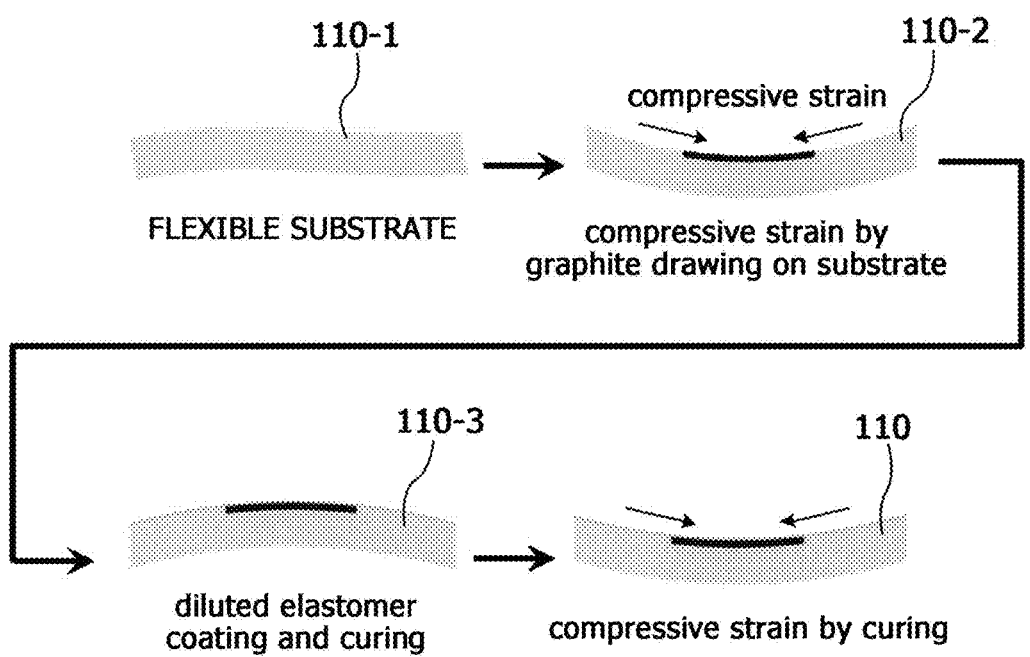
FIG. 9 is a diagram showing the process of forming curl on a substrate in an input device using a highly sensitive pressure sensor according to an embodiment of the present invention.

For example, it is possible to use the property of the flexible substrate 110-1 having flexibility and strain generated during a process of forming the electrodes 111 and 121 and the dielectric 130, e.g., compressive strain based on the difference of the coefficient of thermal expansion formed between the flexible substrate 110-1 and the dielectric 130 after curing to form the curls on the lower substrate 110 and the upper substrate 120 so that the substrates 110 and 120 are concave toward the dielectric 130, as shown in FIG. 9.

Referring to FIG. 10, by using the curl formed in the way described above, it is possible to form an air layer (e.g., a large air layer 310) between the facing dielectrics 130 of the lower substrate 110 and the upper substrate 120 that the pressure sensor 100 have.

The air layer 310 between the dielectrics decreases an elastic resistance in the case where the pressure 300 is applied to the pressure sensor 100, and since the distance d between electrodes varying when the pressure 300 is applied relatively increases, a variation in capacitance may increase.

Also, the air layer 310 betweens the dielectrics may be removed due to the engagement of the micro-structure formed on the dielectric 130 or changed to a plurality of small air layers, in the case where the pressure 300 is applied to the pressure sensor 100.

Since the dielectric constant of the air is 1 that is smaller than the dielectric constant (=about 3) of elastomer, the large air layer 310 is changed to a small air layer based on an interlocked structure 320 or removed to cause a variation in dielectric constant when the pressure 300 is applied, thus since it is possible to significantly increase effective dielectric constant, a variation in capacitance may increase.

As described above, it is possible to form an artificial structure on the dielectric, form roughness and a micro-structure according to the roughness on the dielectric 130 even without performing photo-lithography, etching, etc. processes, and increase the difference of capacitance by using the air layer formed between the dielectrics 130, so it is possible to enhance the sensitivity of the pressure sensor 100. In general, the sensitivity of a capacitive pressure sensor may be described by the using of Equation 4 below:

$$S = \frac{\Delta C / C_0}{\Delta P} \quad (4)$$

(where P denotes applied pressure, $C_0$ denotes capacitance before pressure is applied, and C denotes capacitance after pressure is applied).

Figure 11B:
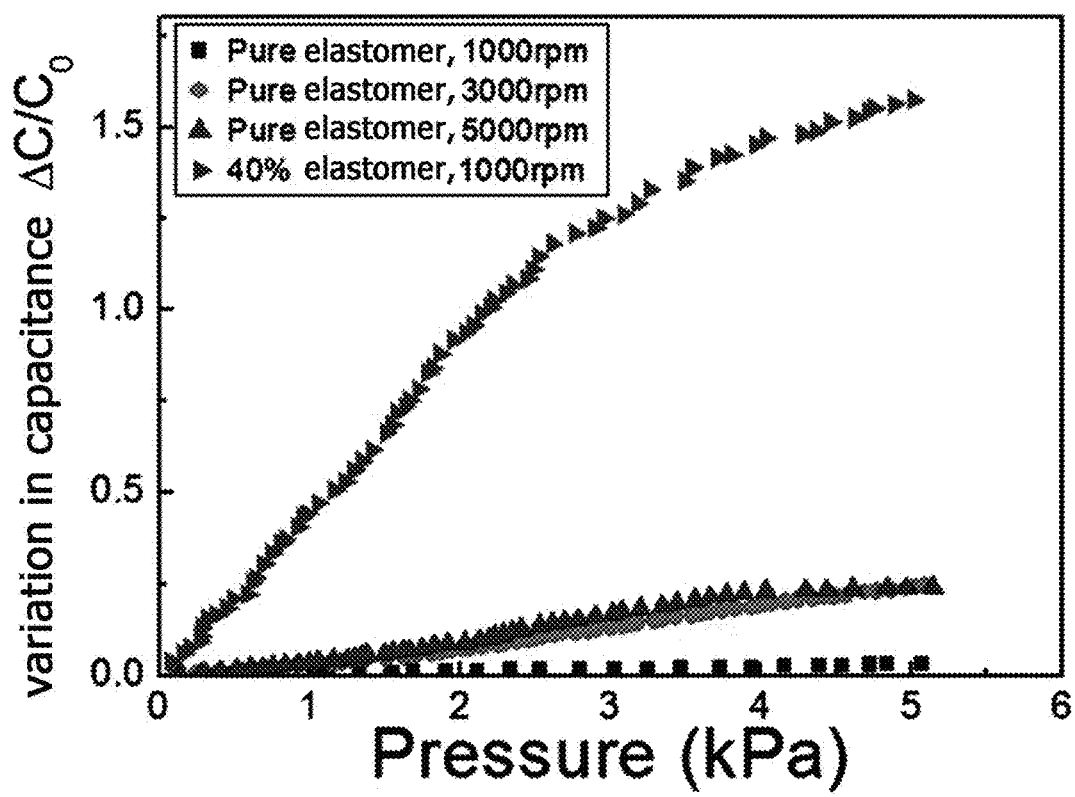

Since a variation in capacitance increases based on Equation 4 as described above, the sensitivity of the pressure sensor 100 is enhanced, so it is possible to see a graph of sensitivity as shown in FIGS. 11A and 11B by using the pressure sensor 100 according to various embodiments of the present invention.

Referring to FIG. 11A, the sensitivity of the pressure sensor 100 may be determined based on the dilution level of elastomer that is used as the dielectric 130. At this point, when elastomer diluted with hydrocarbon is used, it is represented that the sensitivity of the pressure sensor 100 records a high figure, and it is possible to see that the sensitivity is the highest especially when the elastomer is 40 wt. %.

Since the elastic resistances of the lower substrate 110 and/or the upper substrate 120 increase near a flat surface, it is difficult to decrease the distance d between electrodes and it is difficult to obtain the effect of increasing effective permittivity or increasing the area A between electrodes. This may be easily seen through the sensitivity of the pressure sensor using 100 wt. % elastomer (not diluted with hydrocarbon).

Even in the case of the pressure sensor using the 100 wt. % elastomer, it is possible to form a curl of a flexible substrate due to the influence of compressive strain in a manufacturing process, but this is actually insignificant. A property that a material itself may be easily foldable or bent is related to Equation 5 below:

$$D = \frac{Et^3}{12(1 - v^2)} \quad (5)$$

(where t denotes the entire thickness of a pressure sensor).

In terms of flexural rigidity, the rigidity of a material itself significantly increases when a thickness becomes thick. That is, since in the case of the 100 wt. % elastomer, the elastomer itself is significantly thick, it is not easy to form a curl in comparison to the case of diluted elastomer. In addition, even when the curl is formed, the lower substrate 110 adheres to the upper substrate 120 due to the high viscosity of elastomer itself in the case where the pressure 300 is applied, so in an aspect of the efficiency of a sensor, it is possible to cause a negative effect.

On the contrary, it is predicted that sensitivity is improved as more elastomer is diluted with hydrocarbon, e.g., the weight percentage of the elastomer decreases to below 40 wt. %, but since a function as a dielectric is lost due to the influence of a defect, such as a pin-hole, there may be a limitation in performing the function as the dielectric.

Thus, the weight percentage (or weight ratio) of elastomer according to an embodiment of the present invention maintains 40 wt. %, but the embodiment is not limited thereto and the dilution level of the elastomer may vary according to the roughness of a used electrode.

In other words, it is possible to adjust the dilution level based on the roughness of the material used as the electrode to form the roughness of a dielectric 130 surface and accordingly, it is possible to significantly enhance the sensitivity of the pressure sensor 130.

Referring to FIG. 11B, in forming dielectrics on the electrodes 111 and 121, it is possible to see that sensitivity may be more effectively enhanced when forming the dielectrics 130 by the using of diluted elastomer rather than controlling the thickness of the elastomer to be formed, e.g., making the elastomer thin by the increasing of the RPM of a spin coater.

Figure 12A:
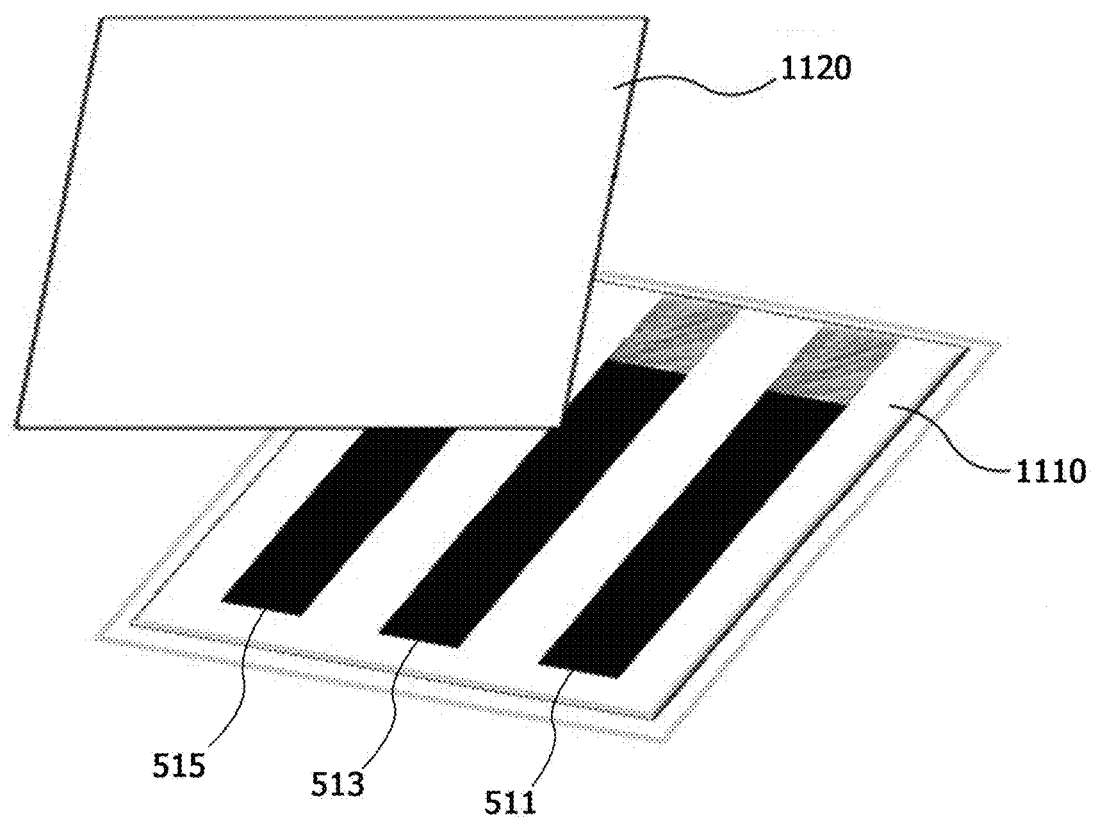
FIG. 12A is a diagram showing a 3×3 pressure sensor array including an input device using a highly sensitive pressure sensor according to an embodiment of the present invention.

When expanding the highly sensitive pressure sensor to a wide area, it is possible to manufacture and overlap an array of pressure sensors on overlaying and underlying flexible substrates 1110, 1120 to form pressure sensors that include a plurality of contact points, as shown in FIG. 12A.

For example, when forming and overlapping a three-line pressure sensor array 511, 513, and 515 on the lower substrate 1110 and likewise, a three-line pressure sensor array (not shown) on the upper substrate 1120, it is possible to generate pressure sensors that include nine contact points.

According to various embodiments of the present invention, it is possible to use significantly enhanced sensitivity to divide values measured from the pressure sensor 100 into various steps. For example, as shown in FIGS. 11A, 12B, and 13, it is possible to determine the sensitivity of the pressure sensor 100 based on a variation in pressure (or weight) and a variation in capacitance and the variations, and it is possible to use the sensitivity and the variations to divide pressure (or weight) applied to the pressure sensor 100 into a plurality of levels.

Figure 13:
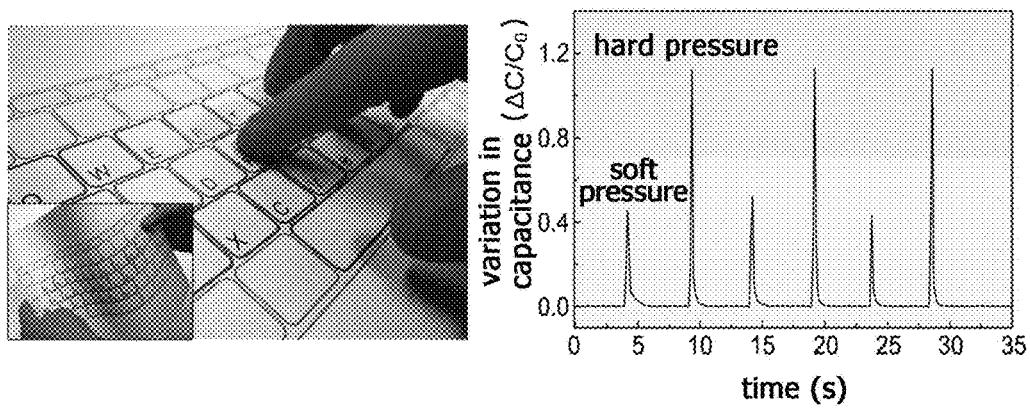
FIG. 13 is a diagram showing a variation in capacitance relative to pressure applied to a pressure sensor in an input device using a highly sensitive pressure sensor according to an embodiment of the present invention.

At this point, referring to FIG. 13, in the case where typing is performed as shown in the left image, the pressure sensor 100 according to various embodiments of the present invention may apparently output, in a wide range, a variation in capacitance measured as shown in the right image according to applied pressure, so it is possible to determine a reference point for identifying the level of pressure based on the size (figure) of the capacitance.

According to an embodiment, as shown in the upper graph in FIG. 11A, in the case of the pressure sensor 100 in which 40 wt. % elastomer is used as the dielectric 130, it is possible to see pressure at which sensitivity significantly varies. For example, it is possible to see sensitivity of 0.62 kPa-1 between 0 kPa and 2 kPa, and it is possible to see that sensitivity significantly varies to 0.28 kPa-1 between 2 kPa and 6 kPa.

In general, the pressure sensor of a keyboard commercially available is represented as sensing a weight of about 5 kPa to about 6 kPa (50 g to 60 g). Thus, in handling the sensitivity of the pressure sensor 100, it is possible to identify pressure lower than 6 kPa as a first pressure range and pressure higher than 6 kPa based on 6 kPa (e.g., a first reference pressure), and it is possible to replace a general keyboard input by using first pressure.

At this point, it is possible to perform another key input by using second pressure. For example, in the case where the pressure of the first pressure range is sensed through the pressure sensor 100, it is possible to input a key of a general keyboard, e.g., a lower-case letter. On the contrary, in the case where the pressure of the second pressure range is sensed through the pressure sensor 100, it is possible to handle that another designated key is input.

According to an embodiment, in the case where the pressure of the second pressure range is sensed through the pressure sensor 100, it is possible to input a key input in a state in which a specific key (e.g., shift key) of a general keyboard is pressed, e.g., an upper-case letter.

Also, it is obvious that a pressure range based on the sensitivity of the pressure sensor 100 is not limited to a division into two levels and may be divided into various levels. For example, in the case of a capacitive non-contact keyboard, it is possible to sense a weight of 3 kPa (or 30 g), decrease input job fatigue and implement a smooth touch.

Thus, according to an embodiment, when in the case of a general keyboard, it is assumed that a key input is performed by the sensing of pressure of 3 kPa to 6 kPa, it is possible to further determine a third pressure range lower than 2 kPa based on 2 kPa (e.g., second reference pressure) at which sensitivity significantly varies through the pressure sensor 100, and it is possible to handle the pressure sensed within the third pressure range as an input of another designated key.

For example, in the case of a keyboard, it is possible to key an input in response to a brushing wrong input during user's quick typing. Thus, it is possible to determine that the pressure of the third pressure range is not a user's key input and accordingly, it is possible to decrease typographical errors during user's typing.

Figure 14:
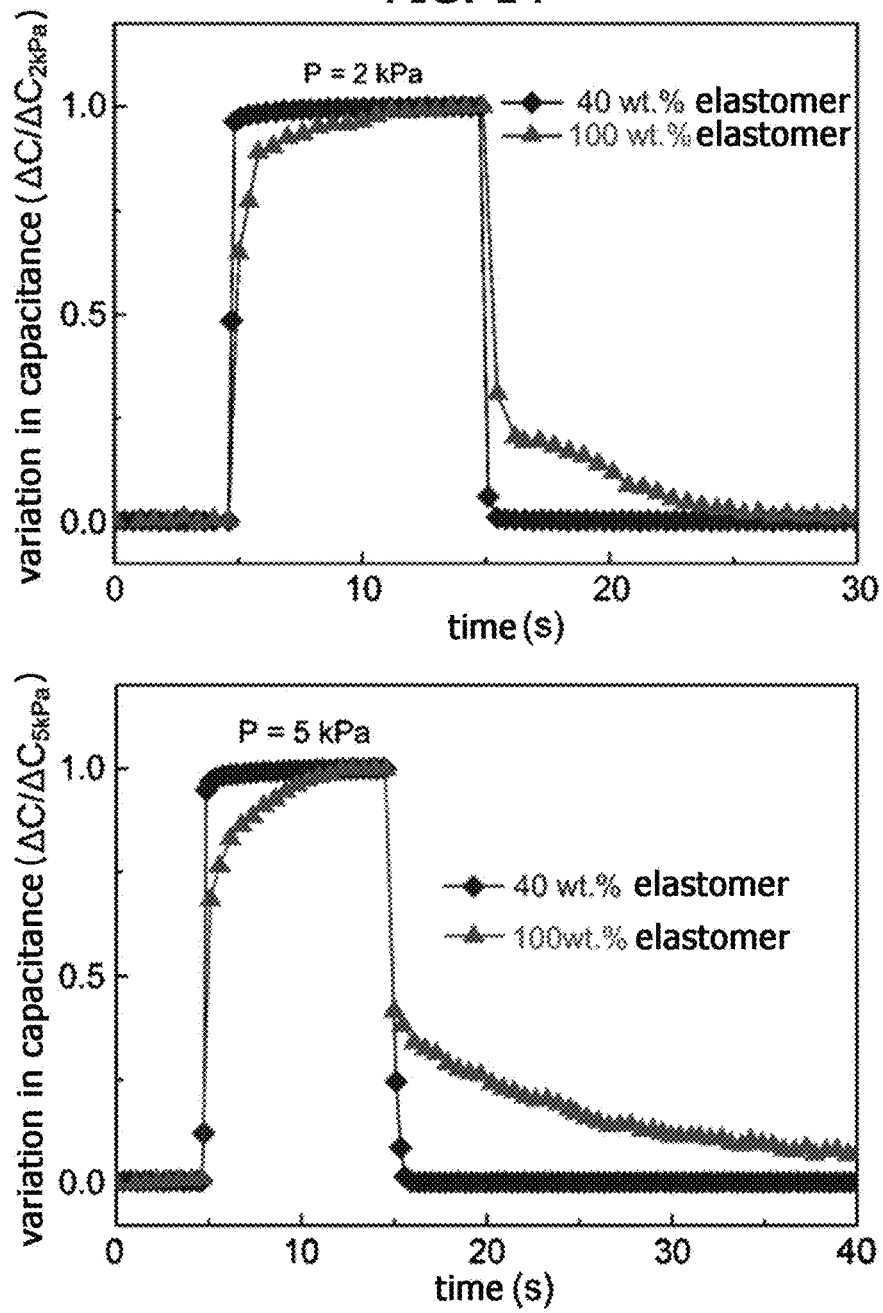
FIG. 14 is graphs of a response time and relaxation time according to pressure applied to a pressure sensor in an input device using a highly sensitive pressure sensor according to an embodiment of the present invention.

Referring to FIG. 14, the pressure sensor 100 according to various embodiments of the present invention is formed to not only have high sensitivity as described above but also have a fast response time and a relaxation time.

For example, the dilution weight percentage of elastomer making up the dielectric 130 may be not only a configuration for forming the roughness of a dielectric surface as described above but also a configuration for enhancing the response time and relaxation time of the pressure sensor 100.

According to an embodiment, as shown in FIG. 14, when comparing pressure sensors in which the weight percentages of elastomer making dielectrics are 100 wt. % and 40 wt. %, it is possible to see that the response time and relaxation time of the 40 wt. % pressure sensor 100 are shorter than those of the 100 wt. % pressure sensor at both pressure of 2 kPa and pressure of 5 kPa.

In addition, the pressure sensor 100 may use the elastic property of the flexible substrate 110-1 making up the pressure sensor 100, to enhance the fast response time and relaxation time. For example, a paper, plastic, etc. flexible substrate has a property that it reversibly maintains a shape over a certain bending radius even when being bent by using pressure. At this point, since strain due to normal force applied from the pressure sensor 100 is significantly great in bending radius, it is possible to quickly recover an original shape.

Figure 15:
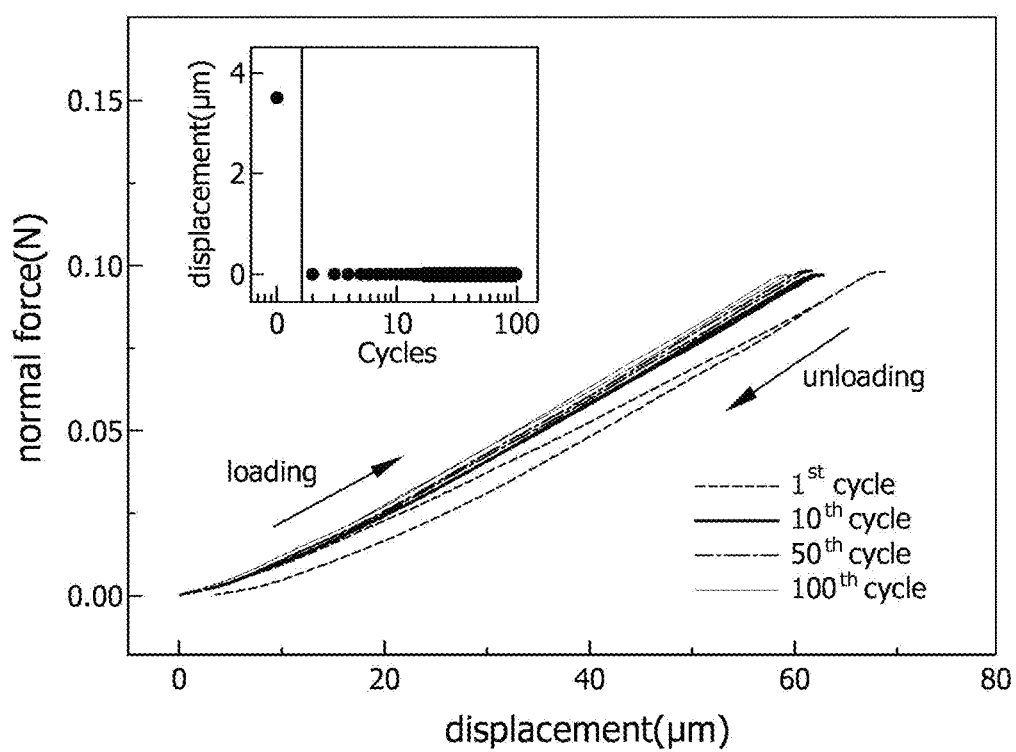
FIG. 15 is a nano indentation analysis graph of a flexible substrate making up an input device using a highly sensitive pressure sensor according to an embodiment of the present invention.

According to an embodiment, as shown in FIG. 15, it is possible to perform a test in which a force of 0.1N (≈10 kPa) is repetitively applied to the flexible substrate 110-1 on which a curl having a width of 0.09 cm2 is formed. At this point, with respect to the pressure applied repetitively to the flexible substrate 110-1, the curl of the flexible substrate 110-1 shows irreversible strain at first and a reversible elastic property after that.

In general, the flexible substrate 110-1 itself may be included in a viscoelastic material like elastomer, so it may be determined that the response time and the relaxation time are long. However, a flexible substrate on which a curl is formed may be structurally significantly short in response time and relaxation time and reversibly recover a shape.

According to the descriptions above, it is possible to model the reversible elastic property of the pressure sensor 100. To this end, it is possible to apply the Kelvin-Voight model for a strain-stress property related to a viscoelastic material. The Kelvin-Voight model is a model representing the viscoelastic material and may express as the parallel connection of a spring representing elasticity and a dashpot representing viscosity to model the relation between their strain and stress as in Equation 6 below:

$$\sigma_{total} = \frac{1}{3} * (\sigma_{curl} + \sigma_{elastomer} + \sigma_{substrate}) \quad (6)$$

$$= \frac{1}{3} * \left\{ \begin{array}{l} (E_{curl} * \varepsilon_{curl}) + (E_{elastomer} * \varepsilon_{elastomer} + \\ \eta_{elastomer}\frac{d\varepsilon_{elastomer}}{dt} + \\ \left(E_{substrate} * \varepsilon_{substrate} + \eta_{substrate}\frac{d\varepsilon_{substrate}}{dt}\right) \end{array} \right\}$$

(where σ denotes normal stress, ε denotes normal strain, $$\frac{d\varepsilon}{dt}$$

denotes a strain rate, E denotes elastic modulus (Young's modulus), and η denotes a viscosity coefficient).

Figure 16:
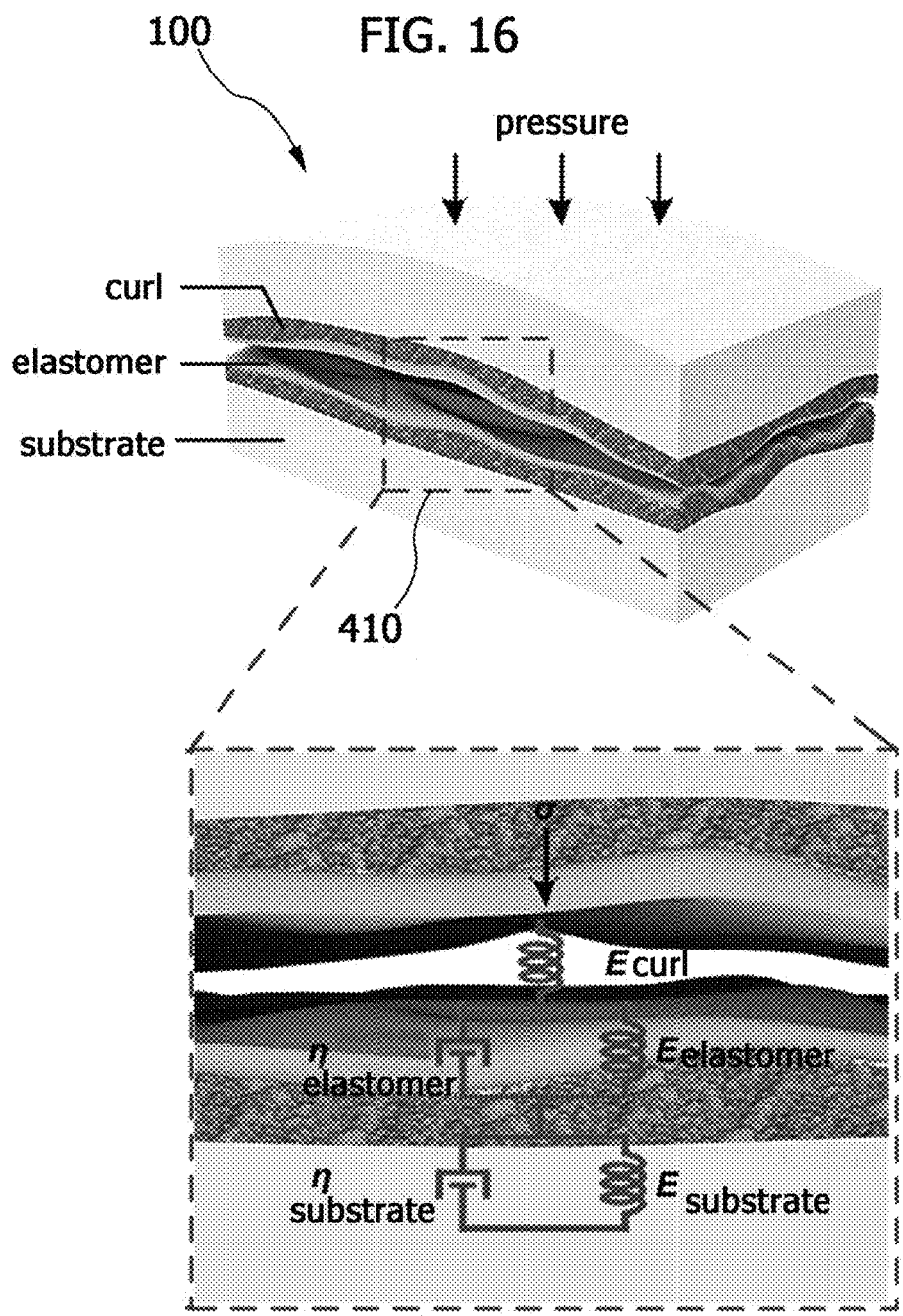
FIG. 16 is a diagram modeling the reversible elastic property of a pressure sensor in an input device using a highly sensitive pressure sensor according to an embodiment of the present invention.

Referring to FIG. 16 and Equation 6, the components of the pressure sensor 100 according to various embodiments of the present invention may roughly include a curl of the flexible substrate 110-1, the dielectric 130, and the flexible substrate 110-1.

At this point, it is possible to see through nano indentation analysis that the curl of the flexible substrate 110-1 is an elastic material, and the curl may be represented by a spring. In addition, since the dielectric 130 and the flexible substrate 110-1 are viscoelastic materials, they each may be represented by the Kelvin-Voight model. The pressure sensor 100 is a structure in which these components are connected in series, and a component that varies for the first time in a serial structure when the pressure 300 is applied may be determined according to their Young's modulus.

As a result of calculation, the Young's modulus (≈30 kPa) of the curl of the flexible substrate 110-1 is the lowest, and the Young's modulus of the dielectric 130 and the flexible substrate 110-1 may be determined to be about 1 MPa and about 20 MPa, respectively. Thus, when pressure is applied, the curl of the flexible substrate 110-1 preferentially varies.

For this reason, as shown in graphs in FIG. 14, the highly sensitive sensing of the pressure sensor 100 is possible and it is possible to secure a fast response time and a fast relaxation time.

Figure 17:
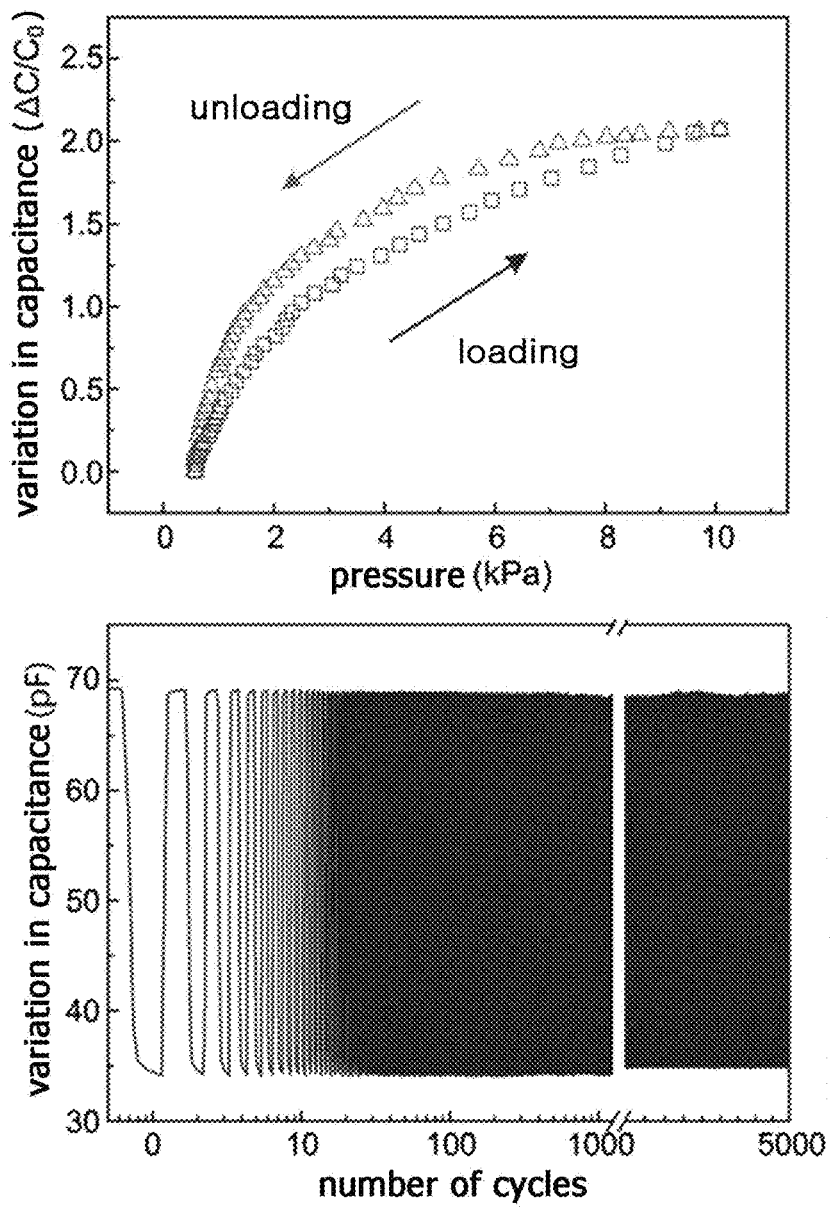
FIG. 17 is a graph of hysteresis and stability of a pressure sensor in an input device using a highly sensitive pressure sensor according to an embodiment of the present invention.

Also, since the pressure sensor has the fast response time and relaxation time, hysteresis hardly occurs as shown in the upper graph in FIG. 17. Also, it is possible to secure stability maintaining performance in spite of about 5000 repetitive pressure tests as shown in the lower graph in FIG. 17.

According to the descriptions above, the pressure sensor 100 not only forms a certain micro-structure through the roughness of the surfaces of the electrodes 111 and 121 and/or the dielectric 130 but also uses the elastic property of the flexible substrate 110-1 making up the pressure sensor 100. Also, in the case where pressure is applied to the pressure sensor 100 by the using of curls formed on the substrates 110 and 120, it is possible to secure a fast response time, a fast relaxation time and highly-sensitive sensing performance.

Turning back to FIG. 1, the control unit 200 of the input device 10 using the highly sensitive pressure sensor includes a main control unit 210, a de-multiplexer 220, and a multiplexer 230. The main control unit 210 performs the function of receiving a signal output from the pressure sensor 100 to transmit the signal to an output device, such as a monitor, simultaneously with generating an excitation signal input to the pressure sensor 100.

Here, the excitation signal may be a signal for capacitance measurement, i.e., a signal input to discern a touch (and/or applied pressure). The de-multiplexer 220 may perform the function of dividing, in parallel, a serial signal received from the main control unit 210 into a plurality of pressure sensors.

The multiplexer 230 is a component that converts parallel input signals received from the plurality of pressure sensors into a serial signal.

The control unit of the input device 10 using the highly sensitive pressure sensor may further include an amplifier 240 and an analog-digital converter (ADC) 250. The amplifier 240 performs the function of amplifying a serial signal output from the multiplexer 230, and the ADC 250 is connected to the output of the amplifier 240 to perform the function of converting an analog signal amplified from the amplifier 240 into a digital signal.

In the following, an example of operating the input device 10 is described.

According to an embodiment, firstly, an excitation signal generated from the main control unit 210 may be divided and applied to a plurality of pressure sensors through the de-multiplexer 220. When a user touches the pressure sensor 100 to perform typing in a state in which the excitation signal is applied, the parallel analog output signal of the pressure sensor 100 may be converted into a serial analog output signal through the multiplexer 230, and such a serial analog output signal may be amplified through the amplifier 240, converted into a digital signal through the ADC 250, and then input to the main control unit 210.

The signal input to the main control unit 210 may be a signal that the excitation signal output firstly to the pressure sensor 100 is modulated by the charging/discharging of a capacitor generated through the pressure sensor 100. A charging/discharging time t and a voltage $V_c$ across a capacitor at a corresponding time may be described by the using of Equation 7 below that is based on the relation between the capacitance C of the pressure sensor, the resistance R of a circuit, and the voltage intensity $V_{signal}$ of the excitation signal:

$$V_c = V_{signal}(1 - e^{-t/RC}) \quad (7)$$

By finding the maximum and minimum voltages input to the main control unit 210 and assigning the period and voltage of an applied excitation signal to Equation 7, it is possible to determine the capacitance value of the pressure sensor 100.

As above, the main control unit 210 may output the capacitance values of the pressure sensor to an output device, such as a computer based on the signal output from the pressure sensor 100.

Since the capacitance value of the pressure sensor 100 is in proportion to applied pressure, it is possible to measure the size of capacitance and use input strength to implement a 3D touch (or 3D force touch) that senses pressure relevant to a plurality of levels.

According to an embodiment, the input device 10 using the highly sensitive pressure sensor may assign an alphabetical letter to each pressure sensor 100, compare measured capacitance with a certain threshold level, and output a lower-case letter in the case where small capacitance is measured and an upper-case letter in the case where large capacitance is measured.

For example, the main control unit 210 may determine first capacitance (e.g., a first signal) corresponding to a pressure range smaller than 6 kPa and second capacitance (e.g., a second signal) corresponding to a pressure range larger than 6 kPa, based on reference pressure input through the pressure sensor 100, e.g., first reference pressure of 6 kPa.

At this time, the main control unit 210 may output a lower-case letter in the case where the capacitance measured through the pressure sensor 100 is included in a first capacitance range, and output an upper-case letter in the case where the measured capacitance is included in a second capacitance range.

Also, the main control unit 210 may determine third capacitance corresponding to pressure smaller than 3 kPa, based on reference pressure input through the pressure sensor 100, e.g., pressure of 3 kPa.

At this time, the main control unit 210 may handle that there is no key input, in the case where the capacitance measured through the pressure sensor 100 is included in a third capacitance range.

As described above, the sensitivity of the pressure sensor 100 is enhanced without significantly changing the process of the pressure sensor, so it is possible to provide an input device that divides pressure measured by the pressure sensor 100 into a plurality of levels to handle various inputs with a single pressure sensor.

An example of operating the input device using the highly sensitive pressure sensor 100 according to an embodiment of the present invention is described with reference to the components of the control unit 200.

Firstly, an excitation signal generated from the main control unit 210 may be divided and applied to a plurality of pressure sensors through the de-multiplexer 220. When a user touches the pressure sensor 100 to perform typing in a state in which the excitation signal is applied, the parallel analog output signal of the pressure sensor 100 is converted into a serial analog output signal through the multiplexer 230, and such a serial analog output signal is amplified through the amplifier 240, converted into a digital signal through the ADC 250, and then input to the main control unit 210. The main control unit 210 may output an output to an output device, such as a monitor based on the signal received from the pressure sensor 110.

Figure 18:
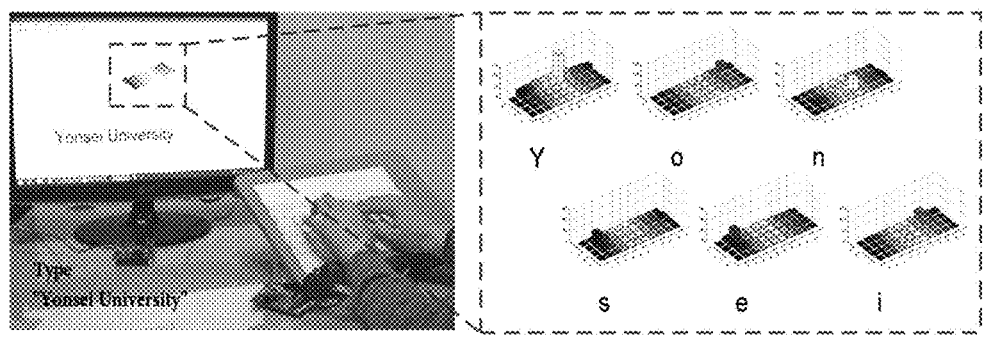
FIG. 18 shows an example where upper cases and lower cases are identified according to applied pressure, and an input device using a highly sensitive pressure sensor according to an embodiment of the present invention.

Referring to FIG. 18, the highly sensitive pressure sensor 100 provided based on various embodiments of the present invention and the input device 10 using the same may be provided as a computer keyboard. Such a computer keyboard may input a word including an upper-case letter and lower-case letters, such as "Yonsei" with only the difference of pressure applied to the pressure sensor 100 as shown in FIG. 18, without using caps lock or shift keys.

The input device 10 using the highly sensitive pressure sensor may identify pressure applied to pressure sensors as shown in the right table in FIG. 18. At this point, when applied pressure is larger than pressure of a designated figure, e.g., pressure larger than reference pressure preset by a pressure sensor designated to output a signal corresponding to the key "y" according to sensed pressure is applied, setting may be performed to output a signal corresponding to its upper-case letter "Y".

Also, according to various embodiments, the control unit 200 in the input device 10 using the highly sensitive pressure sensor may handle (or perceive) a signal output through a corresponding pressure sensor 100 as different inputs according to the strength, time or frequency of pressure applied to the pressure sensor 100.

Although the keyboard is described above as the input device 10 using the highly sensitive pressure sensor, it is obvious that the embodiment is not limited thereto and may be applied to various input devices for inputting a designated key according to pressure, such as a keypad, touch pad, and virtual keyboard.

Also, an input device using a highly sensitive pressure sensor according to an embodiment of the present invention manufactures a pressure sensor by using materials commonly used in a daily life, for example, materials, such as paper and graphite that may manufacture copy paper, pencils, etc., so there is an advantage in that it is possible to provide a significantly low-priced input device according to the reduction of material and manufacturing process costs simultaneously with implementing a high-sensitivity property.

Also, it is possible to provide an bendable input device because the input device is manufactured by using a flexible substrate, and accordingly, there is an effect in that it is possible to provide an input device easy to carry.

Figure 19:
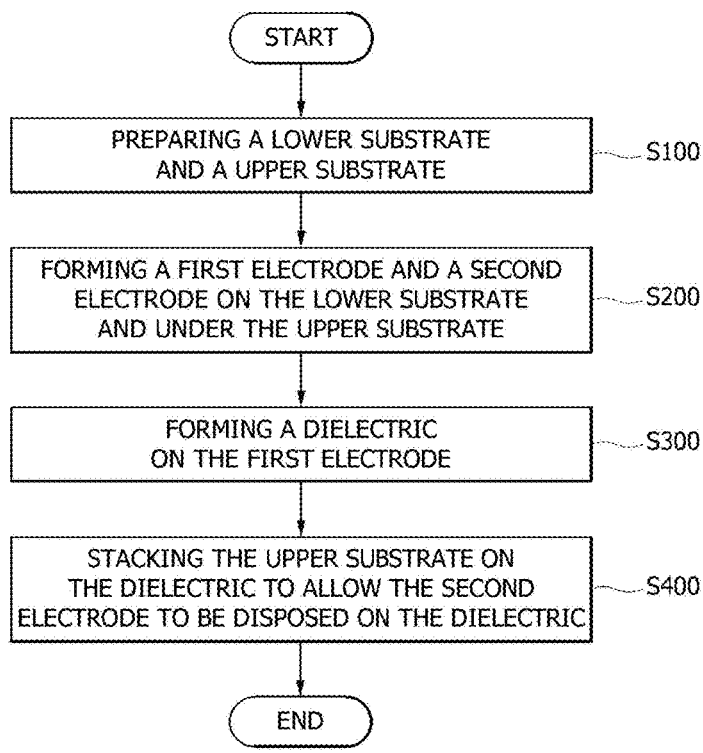
FIG. 19 is a flowchart of a method of manufacturing a highly sensitive pressure sensor according to an embodiment of the present invention.

In the following, the manufacturing method of the highly sensitive pressure sensor 100 according to an embodiment of the present invention is described with reference to FIG. 19, and the detailed description of the content already mentioned in the highly sensitive pressure sensor 100 according to an embodiment of the present invention is omitted.

According to an embodiment, the manufacturing method of a highly sensitive pressure sensor includes preparing a lower substrate and a upper substrate in step S100; forming a first electrode and a second electrode on the lower substrate and under the upper substrate, respectively in step S200; forming a dielectric 300 on the first electrode in step S300; and stacking the upper substrate on the dielectric to allow the second electrode to be disposed on the dielectric in step S400.

An embodiment of the present invention provides a highly sensitive pressure sensor that includes a lower substrate on which a first electrode is formed; an upper substrate under which a second electrode is formed; and a dielectric disposed between the first electrode and the second electrode, wherein the dielectric is elastomer.

According to various embodiments, the lower substrate and the upper substrate may be formed of flexible substrates.

According to various embodiments, the first electrode and the second electrode may be formed on the lower substrate and under the upper substrate by the covering of graphite.

An embodiment of the present invention provides an input device using a highly sensitive pressure sensor, the input device including a plurality of pressure sensors; and a control unit that applies an excitation signal to the pressure sensor and controls the output of the pressure sensor, wherein the pressure sensor includes a lower substrate on which a first electrode is formed, an upper substrate under which a second electrode is formed, and a dielectric disposed between the first electrode and the second electrode, wherein the dielectric is elastomer.

According to various embodiments, the lower substrate and the upper substrate may be formed of flexible substrates.

According to various embodiments, the first electrode and the second electrode may be formed on the lower substrate and under the upper substrate by the covering of graphite.

According to various embodiments, the control unit may include a main control unit (MCU) which generates an excitation signal input to the pressure sensor and to which a signal output from the pressure sensor input; a de-multiplexer that divides the excitation signal into the plurality of pressure sensors; and a multiplexer that converts parallel signals output from the plurality of pressure sensors into a serial signal.

According to various embodiments, the control unit may further include an amplifier that amplifies a serial signal output from the multiplexer; and an analog-digital converter that converts the output of the amplifier into a digital signal.

An input device using a highly sensitive pressure sensor according to an embodiment of the present invention manufactures a pressure sensor by using materials commonly used in a daily life, for example, materials, such as paper and graphite that may manufacture copy paper, pencils, etc., so there is an effect in that it is possible to provide a significantly low-priced input device according to the reduction of material and manufacturing process costs simultaneously with implementing a high-sensitivity property.

Also, it is possible to provide an bendable input device because the input device is manufactured by using a flexible substrate, and accordingly, there is an effect in that it is possible to provide an input device easy to carry.

As described above, the sensitivity of a pressure sensor is enhanced without significantly changing the process of the pressure sensor, so it is possible to provide an input device that divides pressure measured by the pressure sensor into a plurality of levels to handle various inputs with a single pressure sensor.

Although various embodiments of the present invention are described above, the spirit of the present invention is not limited to the embodiments presented in the specification and a person skilled in the art may easily propose other embodiments by the adding, change, deletion, addition, etc. of components within the scope of the same spirit, but the other embodiments would also be within the scope of the spirit of the present invention.

What is claimed is:

1. A highly sensitive pressure sensor comprising:
a lower substrate on which a first electrode having surface roughness is formed;
an upper substrate on which a second electrode having surface roughness is formed; and
a dielectric material stacked between the lower substrate and the upper substrate to be disposed between the first electrode and the second electrode,
wherein the dielectric material comprises:
a lower dielectric layer that the first electrode has; and
an upper dielectric layer that the second electrode has, wherein the lower dielectric layer is in close contact with the first electrode to allow the surface roughness of the first electrode to be represented on the lower dielectric layer, and wherein the upper dielectric layer is in close contact with the second electrode to allow the surface roughness of the second electrode to be represented on the upper dielectric layer.

2. The highly pressure sensor of claim 1, wherein the dielectric material covers an uneven surface of the first electrode or the second electrode by the surface roughness of the first electrode or the second electrode.

3. The highly sensitive pressure sensor of claim 2, wherein the dielectric material comprises elastomer, wherein weight percentage in the dielectric material of the elastomer is determined according to the surface roughness and a thickness of the formed dielectric material.

4. The highly sensitive pressure sensor of claim 1, wherein the lower substrate or the upper substrate is a flexible or stretchable material.

5. The highly sensitive pressure sensor of claim 1, wherein the surface roughness of the first electrode or the second electrode is represented by surface roughness of the lower substrate or the upper substrate.

6. The highly sensitive pressure sensor of claim 1, wherein the surface roughness of the first electrode or the second electrode is generated when an electrode is formed or generated by processing after the electrode is formed.

7. The highly sensitive pressure sensor of claim 1, wherein an air layer is formed in a portion of a region between the lower dielectric layer and the upper dielectric layer.

8. The highly sensitive pressure sensor of claim 7, wherein an interlocked structure is formed by engaging of at least a portion of surfaces of the lower dielectric layer and the upper dielectric layer, in a case where pressure is applied to at least one of the lower substrate and the upper substrate.

9. The highly sensitive pressure sensor of claim 8, wherein the air layer formed between the lower dielectric layer and the upper dielectric layer is removed or divided into smaller air layers based on the interlocked structure, in a case where pressure is applied to at least one of the lower substrate and the upper substrate.

10. An input device using a highly sensitive pressure sensor, the input device comprising:

at least one highly sensitive pressure sensor comprising:
a lower substrate on which a first electrode having surface roughness is formed;
an upper substrate on which a second electrode having surface roughness is formed; and
a dielectric material stacked between the lower substrate and the upper substrate to be disposed between the first electrode and the second electrode; and
a control unit that handles a designated key input according to a signal output from the pressure sensor with respect to applied pressure when pressure is applied to the highly sensitive pressure sensor.

11. The input device of claim 10, further comprising a pressure application unit that applies pressure to one or more of the lower substrate or the upper substrate.

12. The input device of claim 10, wherein the control unit is configured to:
handle as a first signal in a case where the applied pressure is lower than a first reference pressure that is preset, and
handle as a second signal in a case where the applied pressure is equal to or higher than the first reference pressure.

13. The input device of claim 10, wherein the control unit ignores a corresponding input in a case the applied pressure is lower than a second reference pressure that is preset.

14. The input device of claim 10, wherein the control unit perceives as different inputs according to strength, time or frequency of the applied pressure.

15. The input device of claim 10, wherein the control unit comprises:
a main control unit that outputs an excitation signal input to the pressure sensor and inputs the signal output from the pressure sensor;
a de-multiplexer that divides the excitation signal into at least one pressure sensor; and
a multiplexer that converts parallel signals output from the at least one pressure sensor into a serial signal.

16. The input device of claim 10, wherein the control unit divides the signal received through the main control unit into a plurality of levels having a range with respect to the at least one highly sensitive pressure sensor, and different keys are designated for the plurality of levels, respectively.

17. The input device of claim 16, wherein the control unit determines a designated key for a level of the signal based on the signal received through the main control unit and the highly sensitive pressure sensor outputting the signal, and transmits to the multiplexer to input the determined key.

18. The input device of claim 10, wherein the signal is a capacitance value corresponding to applied pressure with respect to the at least one highly sensitive pressure sensor.

19. The input device of claim 10, wherein the dielectric material comprises:
a lower dielectric layer that the first electrode has; and
an upper dielectric layer that the second electrode has,
wherein the lower dielectric layer is in close contact with the first electrode to allow the surface roughness of the first electrode to be represented on the lower dielectric layer, and
wherein the upper dielectric layer is in close contact with the second electrode to allow the surface roughness of the second electrode to be represented on the upper dielectric layer.

* * * * *